United States Patent
Camm et al.

(10) Patent No.: US 6,303,411 B1
(45) Date of Patent: Oct. 16, 2001

(54) SPATIALLY RESOLVED TEMPERATURE MEASUREMENT AND IRRADIANCE CONTROL

(75) Inventors: David Malcolm Camm; Marcel Edmond Lefrancois; Brendon James Hickson, all of Vancouver (CA)

(73) Assignee: Vortek Industries Ltd., Vancouver (CA)

( * ) Notice: Subject to any disclaimer, the term of this patent is extended or adjusted under 35 U.S.C. 154(b) by 0 days.

(21) Appl. No.: 09/303,512

(22) Filed: May 3, 1999

(51) Int. Cl.$^7$ .................................................. H01L 21/00
(52) U.S. Cl. ..................... 438/149; 438/149; 438/166; 438/486; 438/487; 392/416
(58) Field of Search .............................. 438/14, 166, 486, 438/487; 392/416

(56) References Cited

U.S. PATENT DOCUMENTS

| | | | |
|---|---|---|---|
| Re. 36,050 | 1/1999 | Thakur et al. | 374/161 |
| 3,213,827 | 10/1965 | Jenkin | 118/49.5 |
| 3,700,850 | 10/1972 | Lumley et al. | 219/121 LM |
| 4,027,185 | 5/1977 | Nodwell et al. | 313/35 |

(List continued on next page.)

FOREIGN PATENT DOCUMENTS

| | | | |
|---|---|---|---|
| 0576791A1 | 1/1994 | (EP) | H01L/21/00 |
| 06318558 | 11/1994 | (JP) | H01L/21/26 |
| 6318558 | 11/1994 | (JP) | H01L/21/26 |
| 11097371 | 4/1999 | (JP) | H01L/21/26 |

OTHER PUBLICATIONS

Marcel E. Lefrancois, David M. Camm and Brendon J. Hickson, *Emissivity Independent Process Control in a Short Wavelength Arc Lamp RTP Chamber*, in MRS Symposium Proceedings, vol. 429, Rapid Thermal and Integrated Processing V (Pittsburg, Pennsylvania, 1996), p. 321.

D.M. Camm and B. Lojek, *High Power Arc Lamp RTP System for High Temperature Annealing Applications*, Proc. 2$^{nd}$ Int. RTP Conf., RTP'94 (1994) p. 259 (Round Rock Texas).

D.M. Camm, M. Lefrancois, B. Hickson, D. Parfeniuk and B. Lojek, *2D Real Time Temperature Measurements in a New Short Wavelength Arc Lamp RTP Chamber for Improved Uniformity*, Proc. 3$^{rd}$ Int. RTP Conf., RTP'95 (1995) p. 241 (Round Rock Texas).

PCT International Application No. PCT/GB93/01424, filed Jul. 7, 1993, "Radiant Heating Apparatus", PLUMPTRE, David Aubrey; Applicant Severn Furnaces Limited; International Publication Number WO 94/01982, International Publication Date Jan. 20, 1994.

(List continued on next page.)

*Primary Examiner*—John F. Niebling
*Assistant Examiner*—Andre' C Stevenson
(74) *Attorney, Agent, or Firm*—Knobbe, Martens, Olson & Bear, LLP.

(57) ABSTRACT

A method, apparatus and system for producing a desired spatial temperature distribution across a workpiece. The method includes irradiating a plurality of areas on a surface of the workpiece to create localized heating of the workpiece in those areas, to produce the desired spatial temperature distribution in the workpiece, and the apparatus includes means for carrying out the method. The system includes a locator for locating the workpiece in a desired position relative to an energy source, and an irradiance system for carrying out the method. The system further includes a processor circuit in communication with the irradiance system, and a radiation-absorbing environment. The irradiance system includes a measuring system and at least one energy source for directing radiation to the surface of the workpiece.

27 Claims, 15 Drawing Sheets

U.S. PATENT DOCUMENTS

| | | | |
|---|---|---|---|
| 4,356,384 | 10/1982 | Gat | 219/347 |
| 4,482,393 | 11/1984 | Nishiyama et al. | 148/1.5 |
| 4,504,323 | 3/1985 | Arai et al. | 148/1.5 |
| 4,550,245 | 10/1985 | Arai et al. | 219/405 |
| 4,550,684 | 11/1985 | Mahawili | 118/724 |
| 4,581,520 | 4/1986 | Vu et al. | 219/349 |
| 4,636,969 | 1/1987 | Kyoden et al. | 364/560 |
| 4,649,261 | 3/1987 | Sheets | 219/390 |
| 4,661,177 | 4/1987 | Powell . | |
| 4,682,594 | 7/1987 | Mok | 128/303.1 |
| 4,755,654 | 7/1988 | Crowley et al. | 219/405 |
| 4,787,551 | 11/1988 | Hoyt et al. . | |
| 4,794,619 | 12/1988 | Tregay . | |
| 4,818,327 | 4/1989 | Davis et al. | 156/345 |
| 4,851,358 | 7/1989 | Huber . | |
| 4,857,689 | 8/1989 | Lee . | |
| 4,857,704 | 8/1989 | Jannot et al. | 219/354 |
| 4,891,499 | 1/1990 | Moslehi | 219/502 |
| 4,933,887 | 6/1990 | Danko et al. . | |
| 4,937,490 | 6/1990 | Camm et al. | 313/12 |
| 4,956,538 | 9/1990 | Moslehi | 219/121.6 |
| 4,958,061 | 9/1990 | Wakabayashi et al. | 219/411 |
| 4,959,244 | 9/1990 | Penney et al. . | |
| 4,981,815 | 1/1991 | Kakoschke . | |
| 4,984,902 | 1/1991 | Crowley et al. | 374/1 |
| 5,002,630 | 3/1991 | Kermani et al. . | |
| 5,011,794 | 4/1991 | Grim et al. | 437/247 |
| 5,041,714 | 8/1991 | Funk | 219/121.62 |
| 5,073,698 | 12/1991 | Stultz | 219/405 |
| 5,155,336 | 10/1992 | Gronet et al. | 219/411 |
| 5,155,337 | 10/1992 | Sorrell et al. . | |
| 5,196,353 | 3/1993 | Sandhu et al. . | |
| 5,255,286 | 10/1993 | Moslehi et al. | 374/121 |
| 5,275,629 | 1/1994 | Ajika et al. | 29/25.01 |
| 5,279,973 | 1/1994 | Suizu | 437/25 |
| 5,308,161 | 5/1994 | Stein . | |
| 5,310,260 | 5/1994 | Schietinger et al. | 374/142 |
| 5,313,044 | 5/1994 | Massoud et al. | 219/121.85 |
| 5,317,429 | 5/1994 | Mochizuki et al. | 359/42 |
| 5,317,656 | 5/1994 | Moslehi et al. | 385/12 |
| 5,325,180 | 6/1994 | Chappelow et al. | 356/401 |
| 5,347,128 | 9/1994 | Puram et al. | 250/330 |
| 5,350,899 | 9/1994 | Ishikawa et al. | 219/494 |
| 5,359,693 | 10/1994 | Nenyei et al. | 392/418 |
| 5,364,186 | 11/1994 | Wang et al. | 374/126 |
| 5,373,135 | 12/1994 | Beyer et al. | 219/121.67 |
| 5,387,557 | 2/1995 | Takagi . | |
| 5,399,523 | 3/1995 | Kakoschke | 437/173 |
| 5,407,485 | 4/1995 | Takagi . | |
| 5,418,885 | 5/1995 | Hauser et al. . | |
| 5,436,172 | 7/1995 | Moslehi | 437/8 |
| 5,436,443 | 7/1995 | Abtahi | 250/225 |
| 5,442,727 | 8/1995 | Fiory | 392/416 |
| 5,444,217 | 8/1995 | Moore et al. | 219/405 |
| 5,445,676 | 8/1995 | Takagi . | |
| 5,446,824 | 8/1995 | Moslehi | 392/416 |
| 5,446,825 | 8/1995 | Moslehi et al. | 392/416 |
| 5,460,451 | 10/1995 | Wadman | 374/126 |
| 5,487,127 | 1/1996 | Gronet et al. | 392/416 |
| 5,490,728 | 2/1996 | Schietinger et al. | 374/7 |
| 5,508,934 | 4/1996 | Moslehi et al. | 364/468 |
| 5,539,855 | 7/1996 | Takahashi et al. . | |
| 5,561,612 | 10/1996 | Thakur | 364/557 |
| 5,561,735 | 10/1996 | Camm | 392/416 |
| 5,580,388 | 12/1996 | Moore . | |
| 5,593,608 | 1/1997 | Suzuki | 219/492 |
| 5,601,366 | 2/1997 | Paranjpe | 374/126 |
| 5,603,772 | 2/1997 | Ide | 118/724 |
| 5,604,592 | 2/1997 | Kotidis et al. | 356/357 |
| 5,628,564 | 5/1997 | Nenyei et al. | 374/121 |
| 5,635,093 | 6/1997 | Arena et al. | 219/466 |
| 5,635,409 | 6/1997 | Moslehi | 438/7 |
| 5,654,904 | 8/1997 | Thakur | 364/557 |
| 5,677,240 | * 10/1997 | Murakami | 438/609 |
| 5,710,407 | 1/1998 | Moore et al. | 219/405 |
| 5,715,361 | 2/1998 | Moslehi | 392/416 |
| 5,738,440 | 4/1998 | O'Neill et al. | 374/9 |
| 5,802,099 | 9/1998 | Curran et al. | 374/131 |
| 5,822,172 | 10/1998 | White | 361/234 |
| 5,830,277 | 11/1998 | Johnsgard et al. | 118/725 |
| 5,858,819 | * 1/1999 | Miyasaka | 438/149 |
| 5,893,952 | 4/1999 | Aronowitz et al. | 118/725 |
| 5,900,649 | * 5/1999 | Effelsberg | 257/81 |
| 5,937,142 | 8/1999 | Moslehi et al. | 392/416 |
| 5,944,422 | 8/1999 | Doitel et al. | 374/131 |
| 5,993,059 | 11/1999 | O'Neill et al. | 374/126 |
| 5,998,768 | 12/1999 | Hunter et al. | 219/502 |
| 6,016,383 | 1/2000 | Gronet et al. | 392/416 |
| 6,108,490 | * 8/2000 | Young | 392/416 |

OTHER PUBLICATIONS

PCT International Application No. PCT/FR87/00043, filed Feb. 18, 1987, "Apparatus for Thermal Treatments of Thin Parts Such as Silicon Wafers", JANNOT, Marcel Augustin Joseph; PATUREAU, Jean–Pierre; Applicant Bertin & Cie, Societe Anonyme; International Publication WO 87/05054, International Publication Date Aug. 27, 1987.

PCT International Application No. PCT/US91/00266, filed Jan. 18, 1991, "Heating Apparatus for Semiconductor Wafers or Substrates", GRONET, Christian M.; Applicant G–Squared Semiconductor Corporation; International Publication Number WO 91/10873, International Publication Date Jul. 25, 1991.

* cited by examiner

SPATIALLY RESOLVED TEMPERATURE MEASUREMENT AND IRRADIANCE CONTROL

FIELD OF THE INVENTION

This invention relates to irradiance of a workpiece, and more particularly to producing a desired spatial temperature distribution across a workpiece.

BACKGROUND OF THE INVENTION

The manufacture of a semiconductor involves a number of thermal cycles, in which a wafer, typically silicon, is heated from room temperature to a high temperature such as 900° C., for example. Significantly higher or lower temperatures may be required depending upon the particular application. The wafer is heated relatively quickly, with a typical ramp rate of at least 100° C. per second.

During such heating cycles, it is critically important that all points on the wafer remain at a uniform temperature relative to one another. If the temperature distribution across the wafer is non-uniform, thermal gradients will cause the crystal planes within the wafer to slip, thereby breaking the crystal lattice. A very small spatial movement, on the order of 0.2 μm, may completely destroy the crystal lattice. Thermal gradients may also cause other damage, such as warpage or defect generation. Even in the absence of slippage, a non-uniform temperature distribution across the wafer may cause non-uniform performance-related characteristics, resulting in either inadequate performance of the particular wafer, or undesirable performance differences from wafer to wafer.

Thus, the industry defines a "process window", which is an acceptable temperature range in which the temperature of each portion of the wafer must be kept in order to maintain performance goals. In the past, a non-uniformity of no more than ±10° C. across the wafer at all times during the thermal cycle was acceptable.

However, with the manufacture of increasingly high performance semiconductor computer chips, and as larger numbers of device features are required on increasingly compact chips, an increasingly uniform temperature distribution across the wafer is required at all times throughout the thermal cycles, i.e. both during ramp and at a process temperature, which is usually a constant temperature. Industry roadmaps indicate that for devices with 0.25 μm spacing, at a process temperature of 1100° C. a temperature uniformity of ±3° C. (i.e. 3° C.=3σ where σ is the standard deviation of the temperature distribution across the wafer) will be required, and temperature uniformity of ±1° C. (3σ) will be required for devices with 0.18 μm spacing.

In addition, faster ramp rates, on the order of 400° C. per second or higher, will be desired in the near future.

Conventional rapid thermal processing (RTP) techniques do not appear to be capable of achieving either the required degree of uniformity or the desired ramp rate.

One example of a conventional RTP technique includes rotating a wafer, and heating the wafer with a large number of tungsten-halogen lamps, each of which channels radiation toward the wafer surface through one of a large number of light pipes. Wafer temperature is measured with a comparatively small number of stationary pyrometers, each of which measures radiation thermally emitted by the wafer. Each measuring pyrometer is located at a different radial distance from the centre of the rotating wafer, so that the resulting temperature profile describes the average temperatures around a number of annular rings of the wafer, each annular ring corresponding to the radial distance of a particular measuring pyrometer. The resulting temperature versus time profile is then entered into a control computer, which employs a number of feedback control loops to control the power to the individual lamps or group of lamps associated with each pyrometer or sensor.

This technique has a disadvantage, in that it lacks the ability to detect or correct for temperature differences between any two points lying in the same annular ring, due to the constant rotation of the wafer relative to the pyrometers. Thus, while this technique is able to maintain a number of annular rings at relatively uniform average temperatures, it is not capable of either detecting or correcting for circumferential temperature differences. A mere 1% variation of absorption from one side of the wafer to the other may cause more than a 3° C. temperature variation at 1050° C. Thus, this technique is not suitable for the current industry requirements.

Also, to ensure accurate measurements, the plurality of pyrometers must be carefully calibrated, resulting in additional time and effort.

Modifying this technique for a non-rotating wafer would require a large increase in the number of pyrometers, which would lead to serious calibration difficulties, in addition to the added expense and difficulty of designing the hardware and software required to accommodate a large plurality of pyrometers and related control loops.

A further difficulty arises from reflection, by the walls of the process chamber, of radiation reflected or thermally emitted by the wafer. Such reflections may heat the wafer in a non-uniform manner, and may also produce measurement errors.

The substitution of a camera or CCD in this technique would not be practical, partly because the process hardware tends to obscure the view of the wafer, and partly because a camera or CCD would be particularly susceptible to errors induced by internally reflected radiation.

Furthermore, the use of a plurality of heat sources requires manual calibration of each such heat source, with the result that simple replacement of a burnt-out bulb may become a tedious and time-consuming process.

Moreover, the spectral distribution of tungsten-halogen heat sources may pose additional undesirable effects. Tungsten irradiance sources typically produce only 40% of their spectral energy below the 1.2 μm band gap absorption of room-temperature silicon, resulting in an inefficient thermal cycle. Also, the wavelengths generated by tungsten sources may be sufficiently long to penetrate through a substrate side of the wafer and be non-uniformly absorbed by highly-doped features on a device side of the wafer, resulting in an increasingly non-uniform temperature distribution. Such an effect may be aggravated in devices involving insulating layers such as silicon on oxide (SOI). Irradiance fields produced by tungsten sources may be red-shifted as the power supplied to the source is decreased, resulting in even greater inefficiency and greater penetration of radiation into the device side.

In addition, as the temperature of silicon increases, it is able to absorb increasingly longer wavelengths of radiation. Thus, hotter areas of the wafer may absorb greater amounts of energy at the longer wavelengths produced by tungsten-halogen sources than cooler areas of the wafer, resulting in faster heating of the hotter areas and thermal runaway.

An additional problem arises from the slow thermal time constants of tungsten lamps. Fast ramp rates to desired process temperatures require fast feedback controls. For example, heating at 500° C./sec to a process temperature with a uniformity of ±1° C. ideally requires a response time of ±2 ms (±1° C./500° C./sec), whereas tungsten lamps typically have much longer response times of fractions of a second.

Finally, this technique does not appear to be capable of achieving a ramp rate of 400° C. per second which will soon be desired.

Thus, there is a need for a better heating device for semiconductor processing.

SUMMARY OF THE INVENTION

Specific embodiments of the current invention address the above need by dynamically producing a high-resolution spatially resolved temperature profile of the temperature distribution across an entire surface of a workpiece throughout a thermal cycle, and using this spatially resolved temperature profile to produce and maintain a desired temperature distribution at all points across the surface, at all times during the thermal cycle.

In accordance with one aspect of the invention, there is provided a method and an apparatus for producing a desired spatial temperature distribution across a workpiece. The method includes irradiating a plurality of areas on a surface of the workpiece to create localized heating of the workpiece in the areas, to produce the desired spatial temperature distribution in the workpiece. Preferably, irradiating includes exposing each one of the plurality of areas to radiation to produce the localized heating. The method may further include producing a representation of an instantaneous spatial temperature distribution in the workpiece, and producing an instantaneous spatial temperature error distribution as a function of the desired spatial temperature distribution and the instantaneous spatial temperature distribution. Preferably, the method includes absorbing radiation exitant from the surface. Producing the representation may include producing at least one signal representative of radiation intensity from the surface. The method may further include controlling the amount of the localized heating by irradiating in response to the instantaneous spatial temperature error distribution. Optionally, exposing includes directing radiation from at least one energy source to the surface, and selectively varying, as a function of the representation, a variable opacity of each of a plurality of filter portions of a filtering member interposed between the at least one energy source and the surface. The apparatus includes means for carrying out the method.

In accordance with another aspect of the invention, there is provided a system for producing a desired spatial temperature distribution across a workpiece. The system includes a locator for locating the workpiece in a desired position relative to an energy source, and an irradiance system for irradiating a plurality of areas on a surface of the workpiece to create localized heating of the workpiece in the areas, to produce the desired spatial temperature distribution in the workpiece. Preferably, the system includes a processor circuit in communication with the irradiance system, and the processor circuit is programmed to control the irradiance system to expose each one of the plurality of areas to radiation to produce the localized heating. The irradiance system may include a measuring system for producing a representation of an instantaneous spatial temperature distribution in the workpiece.

Optionally, the processor circuit is programmed to control the measuring system to produce an instantaneous spatial temperature error distribution as a function of the desired spatial temperature distribution and the instantaneous spatial temperature distribution. Preferably, the system further includes a radiation absorbing environment for absorbing radiation exitant from the surface.

The measuring system preferably includes an imaging system. The imaging system may include a charge-coupled device, and the processor circuit may be programmed to control the charge-coupled device to produce at least one signal representative of the surface.

Preferably, the irradiance system includes at least one energy source, which may be an arc lamp, for directing radiation to the surface. The irradiance system may further include a filtering member interposed between the at least one energy source and the surface, the filtering member having a plurality of filter portions, each of the plurality of filter portions having a variable opacity, and the processor circuit is programmed to selectively vary, as a function of the representation, the variable opacity of each of the plurality of filter portions, thereby producing the desired spatial temperature distribution in the workpiece.

When applied to a semiconductor wafer as a workpiece, the measurement system has a spatial resolution finer than the preferred smallest thermal scale length in the system and a time response faster than the shortest system time constant. Preferred embodiment of the invention employ a minimal number of measurement devices and a minimal number of heat sources, thus avoiding calibration difficulties and added expenses. Such embodiments also minimize the effects of reflection by the chamber walls of radiation emitted or reflected by the wafer, thereby minimizing an additional source of non-uniform heating of the wafer and also minimizing a source of measurement error which would otherwise interfere with the ability to produce the desired temperature distribution. A short-wavelength arc lamp may be employed as a primary irradiance source, resulting in highly efficient absorption in a thin surface of the substrate side of the wafer, with virtually no penetration of the radiation into the device side. Finally, embodiments of the current invention capable of producing ramp rates on the order of 400° C. per second or even higher may be constructed. Thermal time constants of less than 1 ms for arc lamps make control of these fast ramps possible.

In addition to producing a uniform temperature distribution throughout a thermal cycle, embodiment of the invention may just as easily be used to produce any particular desired non-uniform temperature distribution, or to produce a dynamically changing series of desired temperature distributions.

Further aspects of the present invention will be apparent to one of ordinary skill in the art upon reviewing the specific embodiments described in the following detailed description and accompanying drawings.

BRIEF DESCRIPTION OF THE DRAWINGS

In drawings which illustrate various embodiments of the invention.

DETAILED DESCRIPTION

The present embodiment of the invention dynamically produces a high-resolution spatially resolved temperature distribution profile of an entire surface of a workpiece throughout a thermal cycle, and uses this spatially resolved temperature distribution profile to produce and maintain a desired temperature distribution at all points across the surface, at all times during the thermal cycle.

Figure 1:
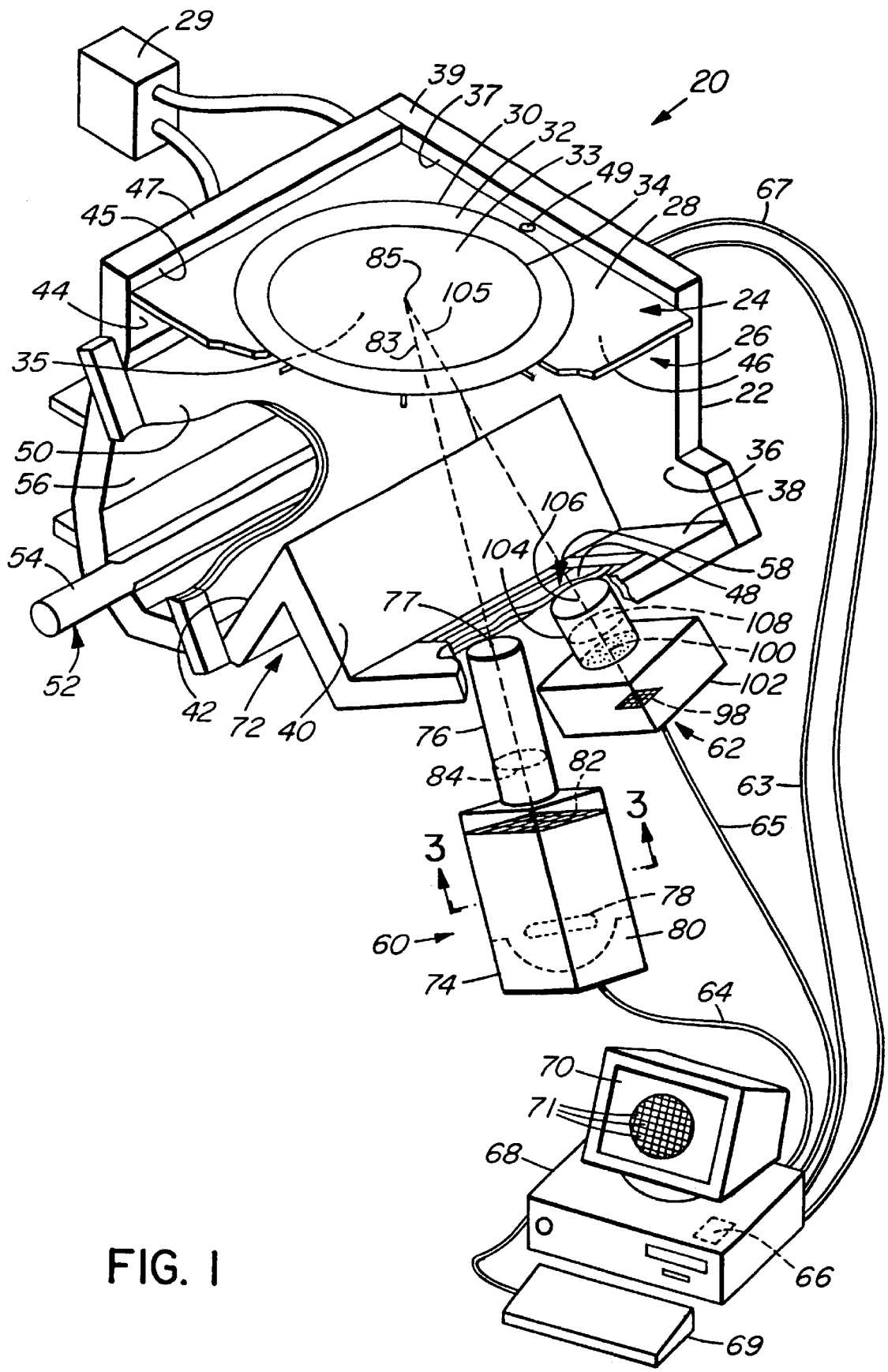
FIG. 1 is a fragmented perspective view of a system for producing a desired spatial temperature distribution across a workpiece, according to a first embodiment of the invention.

As shown in FIG. 1, a system for producing a desired spatial temperature distribution across a workpiece is designated generally by the reference character 20. The system includes a chamber 22 having an upper and a lower portion 24 and 26 respectively, separated by a horizontal internal wall 28. The internal wall 28 has a circular opening 30 in which a guard ring 32 for holding a workpiece 34 is set.

In this embodiment, the workpiece 34 is a silicon wafer used to produce semiconductor chips. The workpiece 34 has an upper surface 33, which is generally a device side, and a lower surface 35, which is generally a substrate side.

The upper portion 24 of the chamber 22 is defined by the internal wall 28, by a first upper portion 37 of a first side wall 36 and a second upper portion 45 of a second side wall 44 which rise above the internal wall 28, by similar upper portions of two side walls not shown, and by a ceiling (not shown) parallel to and above the internal wall 28, attached to a first top surface 39 and a second top surface 47 of the side walls 36 and 44 respectively and to similar top surfaces of the two side walls not shown.

The lower portion 26 of the chamber 22 is enclosed by the internal wall 28, the guard ring 32 and the workpiece 34, by the first and second side walls 36 and 44 and two further side walls (not shown), by first, second and third lower angled walls 38, 40 and 42, and by first and second angled windows 48 and 50. The walls 36, 38, 40, 42, 44 and a lower surface 46 of the internal wall 28 include radiation-absorbing material, which in this embodiment is black stainless steel. The lower portion 26 of the chamber 22 is thus a "black chamber" or radiation-absorbing environment.

A radiation sensor 49 is housed within the internal wall 28, laterally disposed between the guard ring 32 and the first side wall 36, coplanar to the workpiece 34. The second angled window 50 extends downwardly and inwardly from the second side wall 44 somewhat below the horizontal internal wall 28 to the bottom of the third lower angled wall 42 at a base of the chamber 22, and is interposed between the workpiece 34 and a primary energy source 52.

In this embodiment, the primary energy source 52 includes an arc lamp 54 disposed approximately 30 cm beneath the lower surface 35 of the workpiece.

The primary energy source 52 further includes a reflector system 56 extending around and beneath the arc lamp 54 to focus radiation toward the workpiece 34.

The first angled window 48 is sealed within an opening 58 formed in the plane of the first lower angled wall 38. A corrective energy source shown generally at 60 and a measuring device 62 are disposed beneath the first angled window 48 (distally from the workpiece 34).

The primary energy source 52, the corrective energy source 60, the measuring device 62 and the radiation sensor 49 are connected via cables 63, 64, 65 and 67 respectively for communication with a processor circuit 66, which in this embodiment is housed within a general purpose computer 68 having an input device 69 and a display 70. Effectively, the primary energy source 52 and the corrective energy source act together as means for irradiating, the primary energy source acting as primary means for irradiating and the corrective energy source acting as corrective means for irradiating.

Generally, the processor circuit 66 controls the primary energy source 52 and/or the corrective energy source 60 to produce a radiation image on the workpiece in response to a thermal image at the workpiece, as measured by the measuring device 62.

More particularly, the measuring device 62 periodically measures data representing a spatial temperature distribution across the lower surface 35 of the workpiece 34. If the processor circuit 66 detects any deviations from a desired temperature distribution, the processor circuit will cause the corrective energy source to selectively irradiate particular areas of the lower surface to correct such deviations. For example, if the desired temperature profile is a uniform temperature distribution, and the processor circuit detects a "hot spot", the processor circuit will cause the corrective energy source to apply proportionally greater radiation to all other areas of the workpiece 34 than the hot spot, thus heating the cooler areas to arrive at the desired uniform temperature distribution.

Chamber

To achieve suitable accuracy in temperature measurement, it is desirable that the lower portion 26 of the chamber 22 act as a "black chamber". To achieve this, the internal wall 28, the first and second side walls 36 and 44 and the two other side walls not shown, and the three lower angled walls 38, 40 and 42, are made of black stainless steel.

Alternatively, other suitable radiation-absorbing materials could be used, such as anodized aluminum for example. Or, the walls could be composed of virtually any thermally conductive material and coated with a radiation-absorbing substance such as black nickel coating or paint containing graphite, for example.

The radiation-absorbing surfaces may be covered with (or alternatively, made from) non-contaminating material, such as $SiO_2$ (quartz), for example. Thus, the inside surfaces of the chamber 22 may be formed of non-contaminating material such as quartz, with back surfaces formed of radiation-absorbing material.

When radiation from the primary energy source 52, the corrective energy source 60, or radiation exitant from the lower surface 35 of the workpiece 34 strikes any of the walls forming the lower portion 26 of the chamber, such radiation is absorbed rather than reflected. Thus, each of the above walls acts as a radiation-absorbing surface for absorbing radiation exitant from the workpiece surface.

In this specification, including the claims, the noun "exitance" and corresponding adjective "exitant", in relation to radiation from a surface, mean radiant exitance, i.e., the total power at all wavelengths leaving a unit area surface. "Radiation exitant" from the lower surface 35 of the workpiece 34 thus includes radiation both reflected and thermally emitted by the lower surface at all wavelengths.

Additionally, the walls 28, 36, 38, 40, 42 and 44 and the two side walls (not shown) are water-cooled by a cooling system 29 for cooling the radiation absorbing surfaces, to prevent the temperature of the walls from increasing as radiation is absorbed, thus inhibiting thermal emission of radiation by the walls. The water-cooled, radiation-absorbing walls 28, 36, 38, 40, 42 and 44 thus act as a radiation-absorbing environment which includes at least one radiation absorbing surface.

The second and third lower angled walls 40 and 42 rise upwardly from the base of the chamber 22 and inwardly toward the centre of the chamber, and intersect to form an inverted-"V"-shaped barrier 72 interposed between the second angled window 50 and the first lower angled wall 38. The barrier 72 rises to a sufficient height within the lower portion 26 of the chamber 22 to completely block the second angled window 50 from the view of the first angled window 48, preventing radiation from travelling directly from the primary energy source 52 or the second angled window 50 to the measuring device 62.

Similarly, the first lower angled wall 38 in which the first angled window 48 is mounted extends upwardly and outwardly from the bottom of the second lower angled wall 40 at the base of the chamber to intersect a side wall (not shown). The second angled window 50 and the first lower angled wall 38 in which the first angled window 48 is mounted are thus oriented so as to rise vertically and outwardly from the base of the chamber 22, at angles sufficiently steep to ensure that the windows do not reflect radiation emitted or reflected by the workpiece 34 back to the workpiece.

Thus, since the walls 28, 36, 40 and 44 are radiation-absorbing, the only source of radiation within the field of view of the measuring device 62 is the workpiece 34. The composition and configuration of the walls 28, 36, 38, 40, 42, and 44 and the first and second angled windows 48 and 50 thus prevent reflection from system components from interfering with measurements taken by the measuring device 62 thereby improving the accuracy of temperature measurements, and also minimize non-uniform heating of the workpiece 34 resulting from internal reflection.

In this embodiment, the first and second angled windows 48 and 50 are composed of quartz. It will be appreciated that quartz may absorb infrared radiation thermally emitted by the workpiece, and begin to thermally emit radiation as its temperature rises. To minimize such absorption and thermal emission, the first and second angled windows 48 and 50 are water-cooled by the cooling system 29.

Additionally, the reflective surfaces of the reflector system 56 are oriented so as to minimize any reflection back to the workpiece of radiation exitant from the workpiece.

Near the top of the chamber 22, the guard ring 32 includes the same or similar material as the workpiece, which in this embodiment is silicon. The guard ring is used to reduce edge effects during the thermal cycle, and acts as a locator for locating the workpiece in a desired position relative to an energy source.

In this embodiment, each of the surfaces of the upper portion 24 of the chamber 22—i.e., an upper surface of the internal wall 28, the first and second upper portions 37 and 45 of the first and second side walls 36 and 44 and the similar upper portions of the two side walls not shown, and the ceiling (not shown)—are coated with a highly reflective coating. Thus, in this embodiment the upper portion 24 of the chamber 22 is a reflecting chamber.

Alternatively, however, the surfaces of the upper portion 24 of the chamber 22 may be radiation-absorbing and water-cooled, as described above in the context of the lower chamber, such that the upper portion forms a second "black chamber" or radiation-absorbing environment.

Or, as a further alternative, specific area segments of the surfaces of the upper portion may be reflective, with the remainder of the surfaces being radiation-absorbing. The reflective segments may either have a uniform reflectivity, or alternatively may have different reflectivities. Such reflective segments may be used to improve uniformity.

Primary Energy Source

In this embodiment, the primary energy source 52 includes a water wall arc lamp 54 manufactured by Vortek Industries Ltd. of Vancouver, Canada. In the present embodiment, a 300 kW arc lamp is used, although custom arc lamps with powers up to the order of 1.5 MW could be substituted. The ability to produce hundreds of kilowatts of radiation with a single source enhances uniformity, eliminates the need for calibration of a large number of energy sources, such as an array of tungsten lamps, for example, and similarly eliminates the need for frequent replacement and re-calibration of burned-out bulbs.

In this embodiment, the spectral distribution of the irradiance produced by the arc lamp 54 ranges from 0.2 $\mu$m to 1.4 $\mu$m, resulting in highly efficient absorption by the workpiece, since over 95% of the arc's radiation is below the 1.2 $\mu$m band gap absorption of cold silicon, compared with only 40% for a typical tungsten source, for example.

In addition to increasing absorption efficiency, the shorter wavelength of the arc lamp radiation ensures that such radiation will be absorbed in a relatively thin layer of the lower surface 35 of the workpiece 34. Consequently, the device side or upper surface 33 of the workpiece will be heated only by conduction through the wafer. In contrast, radiation of longer wavelengths such as those produced by tungsten would penetrate further into the wafer, and may be non-uniformly absorbed by highly-doped features on the device side, resulting in an additional source of non-uniform heating.

The spectral distribution of the radiation emitted by the arc lamp 54 is also constant with power, in contrast with tungsten sources which are red-shifted as power is reduced resulting in even lower absorption efficiency and increased penetration into the workpiece.

The processor circuit 66 produces primary energy source control signals to control the arc lamp 54 on and off and to continuously vary the intensity of radiation emitted by the arc lamp. The arc lamp 54 has a fast response time, on the order of one microsecond. Effectively, therefore, the response time of the arc lamp 54 is limited only by the response time of its power supply, which may be as fast as ten microseconds, for example. In this embodiment, therefore, the irradiance system includes at least one arc lamp, which has a response time of less than one millisecond. The response time of the arc lamp is thus significantly shorter than the time constant of thermal properties of a silicon wafer. This makes it ideally-suited to emissivity-compensated temperature measurements (discussed below). The fast response time of the arc lamp also permits accurate feedback control during fast temperature ramps.

The reflector system 56 is shaped so as to cooperate with the arc lamp 54 to produce a generally uniform irradiance field across the lower surface 35 of the workpiece and the radiation sensor 49. However, it will be appreciated that uniform primary irradiation incident on the workpiece does not necessarily produce uniform temperatures across the lower surf ace. For this reason, the corrective energy source is used.

Corrective Energy Source

Referring to FIG. 1, in the present embodiment the corrective energy source 60 is an LCD projector device. The corrective energy source 60 has a body 74 and a first focal barrel 76. A front opening 77 of the first focal barrel 76 is located directly beneath the first angled window 48. Located within the body 74 of the corrective energy source 60 are a secondary energy source 78, a reflector 80, and an LCD panel 82 interposed between the secondary energy source and the first focal barrel. The corrective energy source is oriented so that a central axis 83 of the first focal barrel 76 passes directly through a centre 85 of the workpiece 34 and through the centre of the LCD panel 82. The LCD panel is mounted normal to the central axis 83 of the first focal barrel 76 so that energy from the secondary energy source passes directly through the LCD panel 82 through the first focal barrel to the lower surface 35 of the workpiece.

Figure 2:
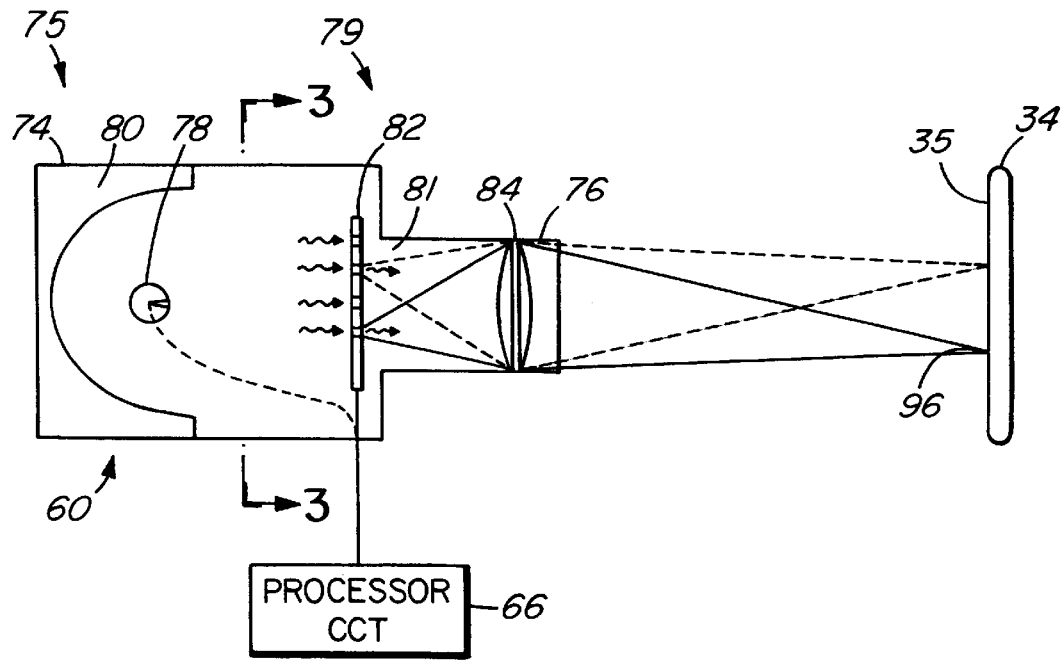
FIG. 2 is a cross-sectional view of a corrective energy source of the system shown in FIG. 1.

Referring to FIG. 2, the corrective energy source 60 is shown in greater detail. The reflector 80 is located at a rear portion 75 of the body 74, while the LCD panel 82 is located at a front portion 79 of the body, immediately behind a rear opening 81 of the first focal barrel 76. The secondary energy source 78, which in this embodiment is an arc lamp, is interposed between the ref lector 80 and the LCD panel 82.

An LCD imaging optics system 84, illustrated by a representative lens in FIG. 2, is housed within the first focal barrel 76. The LCD imaging optics system 84 is somewhat similar to a conventional imaging optics system used for LCD projectors which connect to laptop computers, although a lower resolution will suffice for the purposes of the present embodiment than required for laptop computer projection presentations. The reflector 80 is shaped so as to cooperate with the secondary energy source 78 and the LCD imaging optics system 84 to produce a generally uniform irradiance field across the lower surface 35 of the workpiece, apart from the selective effects of the LCD panel 82. The corrective energy source thus acts as at least one energy source for directing radiation to the lower surface of the workpiece.

Figure 3:
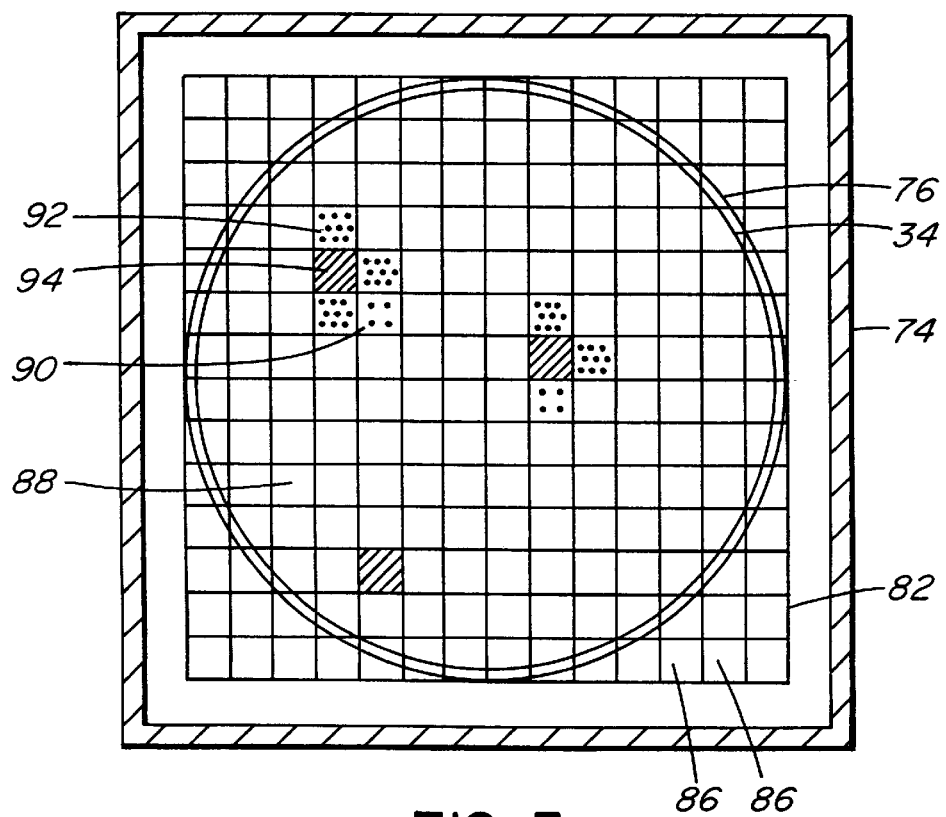
FIG. 3 is a sectional view of the corrective energy source shown of FIG. 1, on line 3—3 shown in FIG. 2.

Referring to FIG. 3, the LCD panel 82 is shown in greater detail. The LCD panel includes a plurality of elements or image producing "pixels" 86. Preferably, the LCD panel comprises at least 32×32 image producing pixels; however, depending on the particular application, a significantly lower density, such as 10×10 pixels for example, may suffice. The light transmissivity of each image producing pixel of the LCD panel 82 is controllable in response to electrical image control signals produced by the processor circuit 66. In this embodiment, each image producing pixel has a greyscale of 16 shades of grey, so that any individual image producing pixel may be controlled to assume any one of the 16 discrete shades of grey, or degrees of light transmission. Alternatively, an LCD panel with image producing pixels having a larger number of degrees of light transmission, such as 256 shades of grey for example, may be substituted. Radiation from the secondary energy source 78 arriving at a particular pixel will either be completely blocked by the pixel, partly blocked, or pass through the pixel essentially undiminished (subject to minimum inherent power loss of an LCD panel), depending upon which of the 16 shades of grey has been assigned to that pixel. For example, FIG. 3 illustrates a transparent pixel 88, a darker pixel 90, an even darker pixel 92, and a totally opaque pixel 94

Referring back to FIG. 2, in effect, the LCD panel acts as a filtering member or radiation image producing device interposed between the secondary energy source 78 and the lower surface 35 of the workpiece, and the plurality of image producing pixels 86 of the LCD panel acts as a plurality of filter or image portions, each having a variable opacity to effectively discretely define a radiation image. Ref erring to FIGS. 3 and 4, the LCD imaging optics system 84 projects the radiation image, defined by the LCD panel 82, onto the entire lower surface 35 of the workpiece 34.

Figure 4:
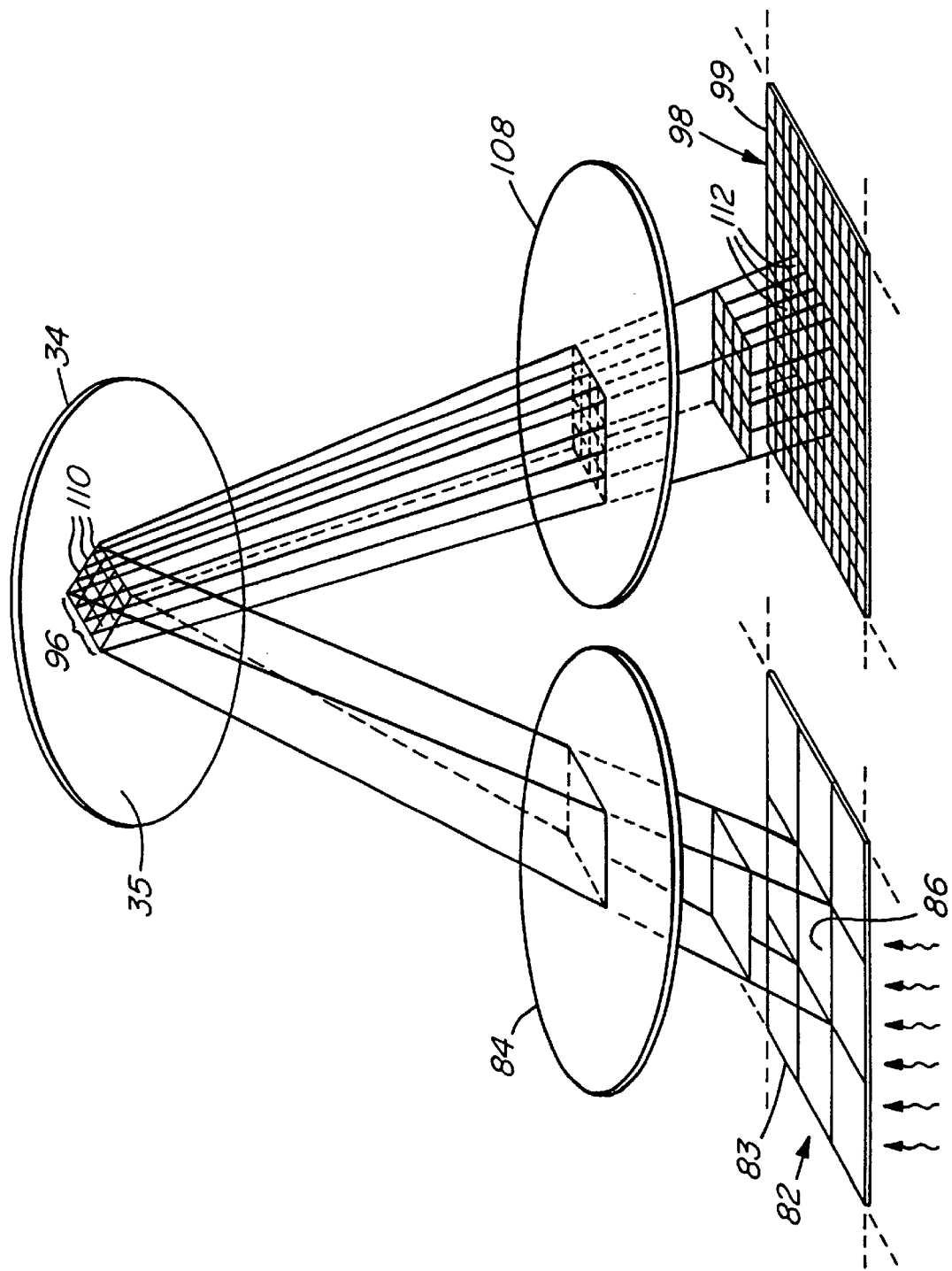
FIG. 4 is a fragmented schematic representation of the workpiece, a measuring device and the corrective energy source of the system of FIG. 1.

As shown in FIG. 4, light passing through a particular one of the image producing pixels 86 on the LCD panel 82 will be focused by the LCD imaging optics system 84 upon a particular corresponding one of a plurality of projection areas 96 on the lower surface 35 of the workpiece 34. In this embodiment, each workpiece projection area corresponding to a given image pixel is approximately 1 cm by 1 cm. The darker the shade of grey assigned by the processor circuit to a particular image producing pixel on the LCD panel, the less energy will be received at the projection area 96 of the lower surface 35 of the workpiece corresponding to that pixel.

Measuring System

As shown in FIG. 1, the measuring device 62 includes a body 102 and a second focal barrel 104. A front opening 106 of the second focal barrel 104 is located directly beneath the first angled window 48. The measuring device 62 is oriented such that a central axis 105 of the second focal barrel 104 passes through the centre 85 of the workpiece 34.

In this embodiment, the measuring device 62 includes a charge-coupled device (CCD) 98 capable of detecting relative temperature differences of ±0.25° C., and a CCD camera optics system 108 illustrated by a representative lens in FIG. 1. The CCD 98 is centred about and normal to the central axis 105 of the second focal barrel 104.

A band-pass filter 100 is disposed within the second focal barrel 104. In this embodiment, the filter is transparent to incident radiation from the workpiece having wavelengths of $\lambda=900\pm5$ nm, and is opaque to other wavelengths. Thus, the measuring system includes a filter interposed between the workpiece and the charge-coupled device, the filter being transparent to radiation within a predetermined wavelength bandwidth and otherwise opaque. The predetermined wavelength bandwidth is centred about 900 nm.

The CCD camera optics system 108 projects an image of the entire lower surface 35 of the workpiece 34 onto the CCD 98. Referring to FIG. 4, radiation reflected or thermally emitted by each one of a plurality of measurement areas 110 on the lower surface 35 of the workpiece 34 is focused by the CCD camera optics system 108 onto a particular corresponding one of a plurality of measurement pixels 112 on the CCD 98. Effectively, the measuring device provides measurement signals representing a thermal image projected onto the CCD. Thus, the measuring system includes an imaging system, which in this embodiment is a charge-coupled device, and the processor circuit is programmed to control the charge-coupled device to produce at least one signal representative of the surface. Alternatively, however, other suitable imaging systems may be substituted.

In this embodiment, a 240×750 pixel CCD is used, so that each one of the measurement pixels 112 on the CCD 98 corresponds to a measurement area 110 of less than 1 mm² on the lower surface 35 of the workpiece. A somewhat lower resolution would also suffice, provided the individual measurement areas 110 measured by the CCD are appreciably smaller than the individual projection areas 96 onto which radiation is selectively projected by the corrective energy source 60, so that the measurement resolution is finer than the projection resolution of the corrective energy source.

In this embodiment, each image producing pixel effectively controls radiation incident upon a projection area of the workpiece measuring 10×10=100 measurement pixels.

The measuring system further includes the radiation sensor 49 housed within the internal wall 28, laterally disposed between the guard ring 32 and the first side wall 36, coplanar to the workpiece 34. An opening (not shown) in the lower surface 46 of the internal wall 28 allows radiation from the primary energy source 52 to be received at the radiation sensor 49. Since the primary energy source 52 produces a generally uniform irradiance field in the vicinity of the lower surface 35 of the workpiece 34, the intensity of incident radiation from the primary energy source 52 received at the radiation sensor 49 is equal to the intensity of incident radiation received at any measurement area 110 on the lower surface 35 of the workpiece. Effectively, therefore, the radiation sensor produces sensor signals representing an intensity of incident radiation received from the primary energy source 52 at the lower surface 35 of the workpiece 34.

In this embodiment, the radiation sensor 49 is a photo diode. However, any other type of radiation sensor with a suitably fast response time may be substituted therefor.

Processor Circuit

Figure 5:
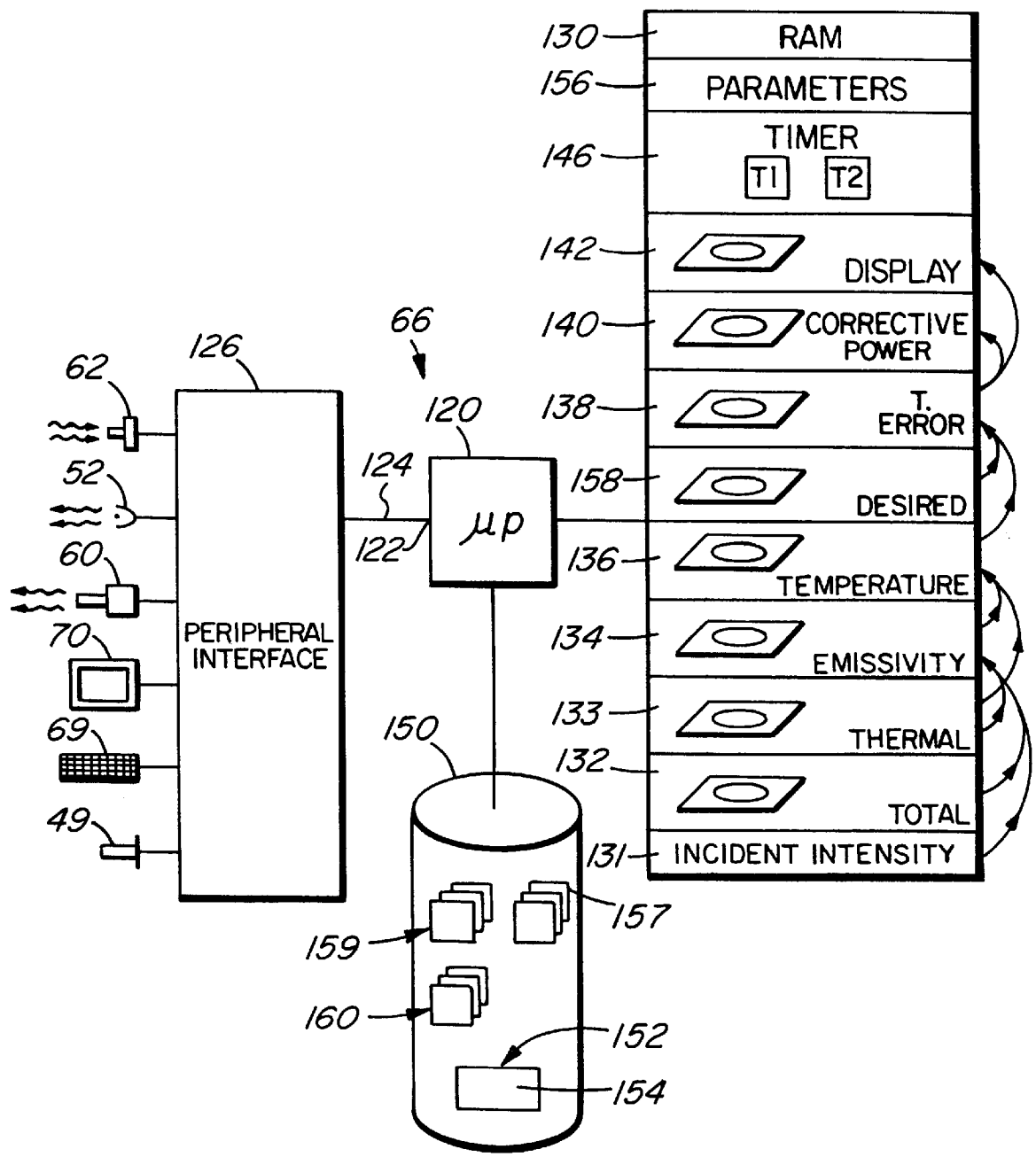
FIG. 5 is a block diagram of memory and a storage device accessible by a processor circuit of the system of FIG. 1.

Referring to FIGS. 1 and 5, in this embodiment the processor circuit 66 housed within the general purpose computer 68 includes a microprocessor 120. The microprocessor 120 is in communication with a peripheral interface 126 for permitting the microprocessor 120 to receive signals from the input device 69, to communicate control signals to and receive measurement signals from the measuring device 62, to communicate control signals to and receive sensor signals from the radiation sensor 49, and to communicate primary energy source control signals to the primary energy source 52, corrective energy source signals to the corrective energy source 60 and display control signals to the display 70. The microprocessor 120 is further connected to a random-access memory (RAM) 130 and to a storage device 150, which in this embodiment includes a hard disk.

The storage device 150 stores instruction codes 152, which in this embodiment are operable to direct the microprocessor 120 to execute a rapid thermal processing (RTP) control routine 154.

The RTP control routine 154 directs the microprocessor 120 to define a plurality of storage areas in the RAM 130 including:

1) an incident intensity store 131 for storing a representation produced by the radiation sensor 49 of an intensity of radiation incident upon the lower surface 35 of the workpiece;
2) a total radiation store 132 for storing a representation produced by the measuring device 62 of an intensity of radiation both reflected and thermally emitted by the lower surface 35 of the workpiece;
3) a thermal radiation store 133 for storing a representation of a received thermal image of the workpiece produced by the measuring device;
4) an emissivity store 134 for storing a representation of an emissivity image of the lower surface of the workpiece;
5) a temperature store 136 for storing a calculated representation of an absolute temperature image of the workpiece;
6) a temperature error store 138 for storing a calculated representation of deviations from a desired temperature distribution across the workpiece;
7) a corrective power store 140 for storing a representation of a corrective power image;
8) a display store 142 for storing a representation of a display image to be displayed on the display 70:
9) a timer store 146 for storing timer values;
10) a parameter store 156 for storing parameters defining a desired thermal cycle; and
11) an instantaneous desired temperature distribution store 158 for storing a representation of a desired temperature distribution across the lower surface at a given instant during the thermal cycle.

Each of the total radiation, emissivity, thermal radiation, temperature, temperature error, display and desired temperature distribution stores 132, 133, 134, 136, 138, 142 and 158 is configured to store a two-dimensional array of values, each value representing a physical property of a particular one of the plurality of measurement areas 110 on the lower surface 35 of the workpiece 34. The incident intensity store 131 is configured to store a single value representing the intensity at each of the measurement areas 110 on the lower surface 35 of incident radiation produced by the primary energy source 52. The corrective power store 140 is configured to store a two-dimensional array of correction values, each value corresponding to a particular image producing pixel 86 on the LCD panel 82 and thus to a corresponding particular one of the plurality of projection areas 96 on the lower surface 35 of the workpiece 34.

The RTP control routine 154 further directs the microprocessor 120 to define in the storage device 150 a parameter folder 157 for storing parameters for one or more pre-defined thermal cycles, a desired temperature distribution folder 159 for storing a plurality of representations of desired temperature distributions across the lower surface of the workpiece at respective instants in time during the thermal cycle at which the temperature of the workpiece is to be measured, and an archive folder 160 for storing information pertaining to the thermal cycle. It will be appreciated that the images in any of the memory stores, such as the representations of spatial temperature distribution across the workpiece stored in the temperature store 136 for example, may be archived for subsequent retrieval and review, thus maintaining a record of the thermal cycle.

Operation

The RTP control routine 154 directs the processor circuit 66 to cooperate with the primary energy source 52, the corrective energy source 60, the measuring device 62, the radiation sensor 49 and the input device 69, in order to produce the desired thermal cycle. The RTP control routine 154 governs both the macroscopic parameters such as how quickly the workpiece is to be heated and the maximum temperature of the thermal cycle, and the microscopic parameters by correcting deviations from the desired temperature distribution across the workpiece throughout the thermal cycle.

Essentially, in addition to directing the processor circuit 66 to control the primary energy source 52 in accordance with the parameters defining the desired thermal cycle, the RTP control routine 154 directs the processor circuit to periodically measure a spatial temperature distribution across the lower surface 35 of the workpiece 34. Upon detecting deviations from the desired temperature distribution, the processor circuit controls the corrective energy source 60 to selectively deliver a greater amount of heat to projection areas on the lower surface which are too cool, the greater amount of heat varying in direct proportion to the temperature difference between each of the cooler areas and the projection area on the workpiece which is hottest relative to its desired temperature.

However, particular measurement areas 110 of the lower surface 35 may have slightly different emissivities than other measurement areas 110, with the result that two of the measurement areas, even though at the same temperature, might thermally emit different intensities of radiation, and conversely, two areas at different temperatures might thermally emit identical intensities of radiation due to their different emissivities. Thus, in order to accurately measure the spatial temperature distribution across the workpiece, the following emissivity-corrected temperature measurement process is adopted.

First, the intensity of radiation reflected and thermally emitted by each of the plurality of measurement areas 110 on the lower surface 35 is measured. Next, the intensity of thermal radiation thermally emitted by each of the measurement areas 110 is measured. Reflectivity and emissivity of each measurement area are calculated from the two measurements. Finally, the temperature of each of the plurality of measurement areas is calculated as a function of the thermal radiation and emissivity results.

Figure 6:
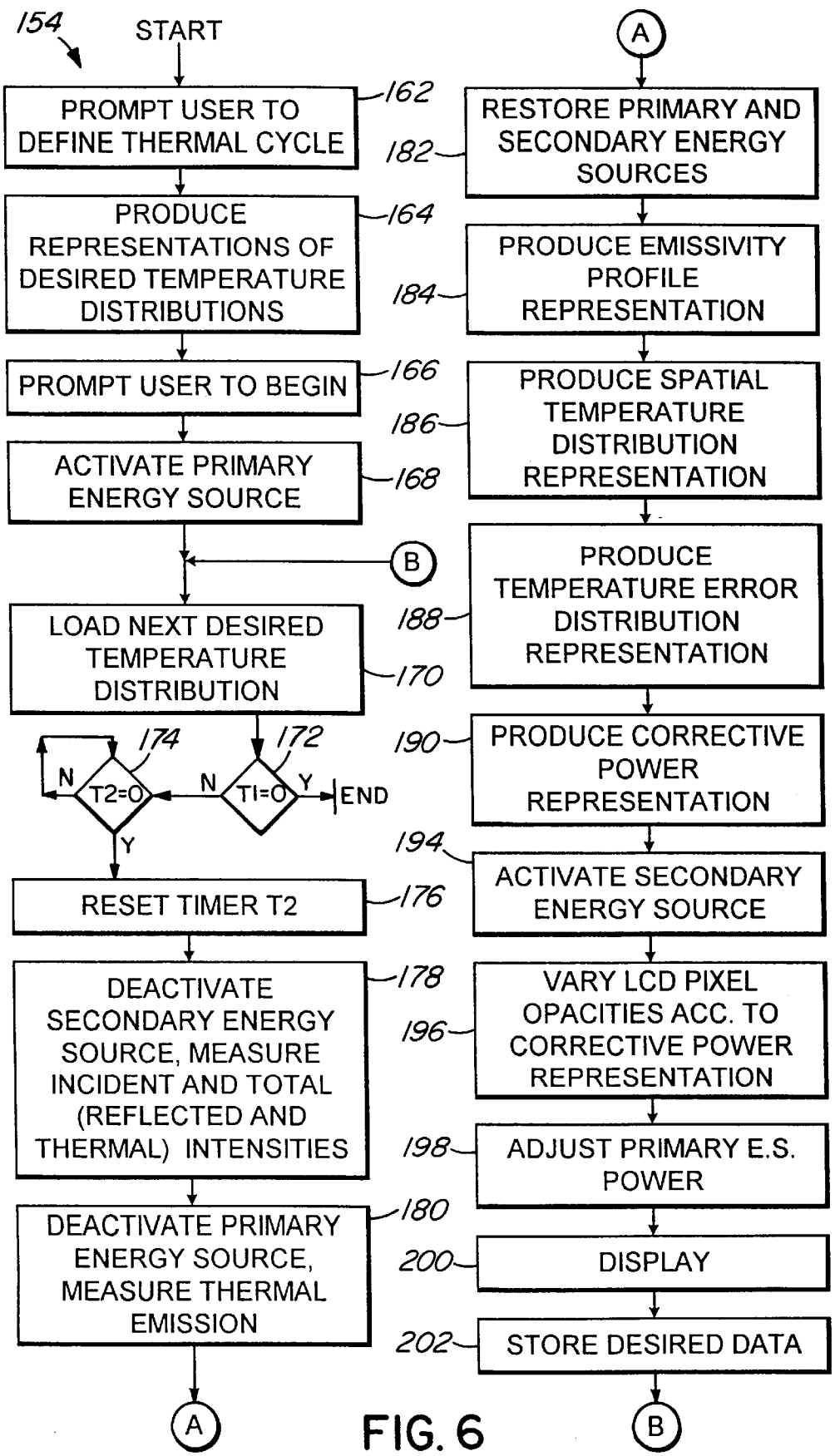
FIG. 6 is a block diagram of a control routine executed by the processor circuit.

Referring to FIGS. 5 and 6, the RTP control routine 154 begins with a first block of codes 162 which directs the processor circuit 66 to produce display control signals to control the display 70 to prompt a user of the system 20 to either select a pre-defined thermal cycle or input parameter data defining a new thermal cycle. In response to user input at the input device 69 indicating a new thermal cycle, the processor circuit is directed to prompt the user to input parameter data defining the desired thermal cycle, including, for example, the total duration of the thermal cycle, the ramp rate (i.e. the rate at which the temperature of the workpiece is to be increased), the desired peak temperature and duration at peak temperature, the desired maximum cooling rate, and the desired temperature distribution (for example, a uniform temperature distribution throughout the cycle). The user may choose to either manually enter the parameter data or insert a computer-readable storage medium such as a floppy or compact disk containing the parameter data into the computer 68 to be read by the processor circuit 66. Alternatively, one or more standard sets of parameters defining thermal cycles desirable for respective standard workpieces may be stored in the parameter folder 157 in the storage device 150, and the user may select a desired pre-defined standard thermal cycle. Such storage of standard sets of parameters is generally preferable, particularly where a thermal cycle will have to be repeated or where the desired temperature distribution in the workpiece is non-uniform or varies over time, in which case it would be time-consuming for a user to manually enter such data. Following such input or selection, block 162 directs the processor circuit to load the parameters other than the desired temperature distribution into the parameter store 156 in the RAM 130. Thus, the parameter store will contain the macroscopic parameters of the thermal cycle, defining the ramp rate, maximum temperature and maximum cooling rate, for example.

Block 164 directs the processor circuit to produce, in accordance with the selected or input parameter data, a representation of a desired temperature distribution across the lower surface of the workpiece for each instant during the thermal cycle at which the temperature of the workpiece is to be measured. The processor circuit is directed to store each such representation in the desired temperature distribution folder 159 in the storage device 150.

Block 166 directs the processor circuit to produce display control signals to control the display 70 to prompt the user to begin the thermal cycle.

In response to user input at the input device 69 indicating that the thermal cycle is to begin, block 168 directs the processor circuit 66 to produce primary energy source control signals to activate the primary energy source 52 at a power level determined by processor circuit as a function of the parameter data stored in the parameter store 156, including the desired ramp rate.

Block 170 then directs the processor circuit 66 to copy a representation of the desired temperature distribution corresponding to the next instant at which the temperature of the workpiece is to be measured from the desired temperature distribution folder 159 into the desired temperature distribution store 158.

At block 172, the processor circuit is directed to read the contents of the timer store 146 to determine whether a first timer bit has been set active by a timer subroutine (not shown) to indicate that the thermal cycle is to be ended. If the first timer bit is active, the processor circuit is directed to produce control signals to deactivate the primary and corrective energy sources 52 and 60, and the RTP control routine is ended.

If at block 172 the first timer bit has not been set active, block 174 directs the processor circuit to read the contents of the timer store 146 to determine whether a second timer bit has been set active by the timer subroutine to indicate that the temperature of the workpiece is to be measured. In this embodiment, the timer subroutine sets active the second timer bit once every 100 ms, such that the temperature of the workpiece is measured at a frequency of ten times per second. However, depending upon the requirements of the particular thermal processing application and on the available processing power, the second timer bit may be set active at a significantly higher or lower frequency. If the second timer bit has not been set active, the processor circuit continues processing at block 174.

If at block 174 the second timer bit has been set active, block 176 directs the processor circuit to reset the second timer bit to zero.

Blocks 178 through 186 then direct the processor circuit to produce an emissivity-compensated representation of the spatial temperature distribution across the lower surface of the workpiece.

Block 178 directs the processor circuit 66 to effectively measure the intensity of radiation incident upon the lower surface 35 of the workpiece 34, and to simultaneously measure the total intensity of radiation reflected and thermally emitted by the lower surface 35 of the workpiece 34.

Block 178 first directs the processor circuit to produce secondary energy source control signals to deactivate the secondary energy source 78 if it had been activated immediately prior to block 178. The processor circuit is then directed to produce sensor control signals to control the radiation sensor 49 to produce sensor signals representing an intensity of incident radiation received from the primary energy source 52 at the radiation sensor. Since the primary energy source 52 produces a uniform irradiance field in the vicinity of the lower surface of the workpiece, the sensor signals thus represent an intensity $I_{incident}$ of radiation received at each measurement area 110 on the lower surface 35 of the workpiece 34. The sensor signals are communicated to the processor circuit 66 through the peripheral interface 126, and the processor circuit is directed to store the received representation of incident intensity incident in the incident intensity store 131.

Simultaneously with producing the sensor control signals, block 178 directs the processor circuit to produce measuring device control signals to control the measuring device 62 to cause the CCD 98 to capture an image of radiation reflected and thermally emitted by the lower surface 35 of the workpiece, for the purpose of emissivity-compensated temperature measurement. Specifically, the image of the lower surface 35 of the workpiece 34 captured by the CCD 98 is a representation of intensity of radiation reflected and thermally emitted by each of the plurality of measurement areas 110 on the lower surface. The processor circuit is further directed to produce measuring device control signals to cause the measuring device 62 to produce measurement signals representing the captured image, which are communicated to the processor circuit 66 through the peripheral interface 126. The processor circuit is then directed to store the representation of intensity of reflected and thermally emitted radiation so received in the total radiation store 132.

Immediately thereafter, block 180 directs the processor circuit 66 to effectively measure the intensity of radiation thermally emitted by the workpiece The processor circuit is directed to produce primary energy source control signals to momentarily turn off or "notch" the primary energy source 52. The secondary energy source 78, having been deactivated at block 178, remains deactivated. During the notch, the processor circuit is directed to produce measuring device control signals to control the measuring device 62 to cause the CCD 98 to capture an image of radiation thermally emitted by the lower surface 35 of the workpiece 34, while the workpiece is not being irradiated. The processor circuit is directed to produce further measuring device control signals to cause the measuring device 62 to produce measurement signals representing the captured image of intensity of thermally emitted radiation, which are communicated to the processor circuit 66 through the peripheral interface 126. In other words, the measuring device 62 acts to produce at least one signal representative of radiation intensity from the surface of the workpiece.

The processor circuit is then directed to store the representation of thermal intensity so received in the thermal radiation store 133.

Immediately thereafter (in this embodiment less than one millisecond later), block 182 directs the processor circuit to produce primary and secondary energy source control signals to restore the primary and secondary energy sources 52 and 78 to their respective states immediately prior to block 178. Due to the fast response time of the arc lamp 54, the total duration of the notch mandated by block 180 is negligible compared to the time constant for thermal properties of the workpiece 34 which in this embodiment is a silicon wafer. Thus, the desired thermal cycle is not significantly affected by the measurement process.

Block 184 then directs the processor circuit 66 to produce a representation of the emissivity of each of the plurality of measurement areas 110 on the lower surface 35 of the workpiece 34. For each of the measurement areas 110, the corresponding representation stored in the thermal radiation store 133 is subtracted from the corresponding representation stored in the total radiation store 132, to yield the intensity of radiation reflected by that measurement area just before the notch, $I_{reflected}$. This difference is divided by the intensity of radiation incident upon that area just before the notch, $I_{incident}$, stored in the incident intensity store 131, which is assumed to be uniform for all of the measurement areas 110.

The result of this division represents the reflectivity of that measurement area 110, and is then subtracted from one to yield the emissivity of that measurement area. In other words, the emissivity of a particular measurement area 110 is defined by $$\epsilon = (1 - r) = 1 - \frac{I_{reflected}}{I_{incident}} \qquad (1)$$

where
$\epsilon$ = emissivity
r = reflectivity
$I_{reflected}$ = intensity of radiation reflected by the measurement area just before the notch (difference between corresponding values in total and thermal radiation stores); and
$I_{incident}$ = intensity of radiation incident upon the measurement area just before the notch (incident intensity store, constant for each measurement area).

Block 184 directs the processor circuit to store the emissivity value for that measurement area into a location in the emissivity store 134 in the RAM 130 corresponding to that particular measurement area 110. The above steps are repeated until an emissivity value has been calculated and stored in the emissivity store for each one of the plurality of measurement areas 110.

Block 186 then directs the processor circuit 66 to produce a representation of an instantaneous spatial temperature distribution across the lower surface 35 of the workpiece 34. For each one of the measurement areas 110 on the lower surface 35, a grey-body emission equation is solved for temperature, by using the value stored in the emissivity store 134 representing the emissivity of that measurement area and the value stored in the thermal radiation store 133 representing the intensity of thermal radiation emitted by that area. For example, the grey-body equation, $$I_{thermal} = \frac{2\pi c^2 h \Delta_\lambda \epsilon}{\lambda^5 (e^{hc/\lambda kT} - 1)} \quad (2)$$

may be solved to yield $$T = \frac{hc}{\lambda k \ln\left(1 + \frac{2\pi c^2 h \Delta_\lambda \epsilon}{I_{thermal} \lambda^5}\right)} \quad (3)$$

where

T= temperature of the workpiece measurement area 110
$I_{thermal}$= intensity of radiation thermally emitted by the measurement area at wavelength λ (from the corresponding location in the thermal radiation store 133)
ε= emissivity of the measurement area 110 (from the corresponding location in the emissivity store 134)
λ= wavelength at which $I_{thermal}$ was measured (in this embodiment, λ=900 nm)
$\Delta_\lambda$= bandpass of the measuring device (in this embodiment, ±5 nm)
c= speed of light
h= Planck's constant
k= Boltzmann's constant
e= Euler's number The only variables are emissivity ε and thermal intensity $I_{thermal}$. Thus, for each of the measurement areas 110, the corresponding emissivity value and thermal intensity value stored in the emissivity store and thermal radiation store respectively are used to solve Equation (3) for temperature T.

The resulting value representing the temperature of that particular measurement area 110 is then stored by the processor circuit 66 in a location in the temperature store 136 corresponding to that measurement area. The processor circuit is directed to repeat the above calculation for all of the measurement areas 110, and thus a representation of the spatial temperature distribution across the entire lower surface 35 of the workpiece is produced by the processor circuit and stored in the temperature store 136. In effect, the processor circuit 66, measuring device 62 and radiation sensor 49 act as a measuring system for producing a representation of an instantaneous spatial temperature distribution in the workpiece, and the temperature store 136 acts as a storage medium in communication with the processor circuit for storing the representation of the instantaneous spatial temperature distribution.

Blocks 188 through 198 then direct the processor circuit to cooperate with the corrective energy source 60 and primary energy source 52 to counteract any deviations or errors from the desired temperature distribution in the workpiece. Block 188 directs the processor circuit to produce an instantaneous spatial temperature error distribution representation, representing an error between desired and actual temperature across the entire lower surface 35 of the workpiece 34. For each measurement area 110, the processor circuit is directed to read the desired temperature of that measurement area stored in a location of the desired temperature distribution store 158 corresponding to that measurement area, and to read the actual temperature of that measurement area stored in the location of the temperature store 136 corresponding to that measurement area. The processor circuit is directed to subtract the desired temperature from the actual temperature to produce a temperature error value, and to store the temperature error value in a location of the temperature error store 138 corresponding to that measurement area. Thus,t the processor circuit is programmed to control the measuring system to produce an instantaneous spatial temperature error distribution as a function of the desired spatial temperature distribution and the instantaneous spatial temperature distribution.

It will be appreciated that the temperature error value will be negative if the actual temperature of the measurement area is cooler than its desired temperature, and positive if the measurement area is hotter than desired. The processor circuit is directed to repeat the above steps until temperature error values for all of the measurement areas 110 have been calculated and stored in the temperature error store 138.

Block 190 directs the processor to produce a corrective power representation of a corrective irradiance image to be projected onto the lower surface 35 of the workpiece by the corrective energy source 60, in order to counteract the temperature errors. The corrective power representation comprises a two-dimensional array of correction values. Each of the correction values is a whole number corresponding to a discrete shade of grey available on the LCD panel 82 in the corrective energy source 60, and thus, each correction value represents a variable opacity of an LCD image producing pixel 86 corresponding to a particular projection area 96 on the lower surface 35 of the workpiece. In this embodiment, the number zero corresponds to the darkest shade of grey (black or opaque) and the number 15 corresponds to the lightest shade of grey (transparent).

Block 190 directs the processor circuit to locate the highest and lowest temperature error values in the temperature error store 138, and to assign correction values of 0 and 15 to the highest and lowest temperature error values respectively. For each of the projection areas 96 on the lower surface, the processor circuit is directed to calculate an average of the temperature error values stored in the locations in the temperature error store 138 corresponding to the particular measurement areas 110 into which the particular projection area 96 is subdivided. The processor circuit is then directed to convert the calculated average temperature error value of the projection area 96 into a correction value between 0 and 15, representing one of the possible shades of grey of the corresponding pixel of the LCD. The conversion is a function of the difference between the highest and lowest temperature error values. The foregoing calculation of correction values is illustrated by way of example in FIGS. 7A through 7C, which are discussed in further detail following block 198 below.

The processor circuit is directed to store each correction value in the location of the corrective power store 140 corresponding to the particular projection area 96, and is then directed to repeat the above steps until correction values have been stored for all the projection areas 96 on the lower surface 35 of the workpiece.

Block 194 the directs the processor circuit to produce secondary energy source control signals to activate the secondary energy source 78 to project a corrective irradiance image through the LCD panel 82 and the LCD imaging optics system 84 onto the lower surface 35 of the workpiece.

The secondary energy source control signals control the secondary energy source to irradiate at a power level proportional to the temperature difference between the highest and lowest temperature error values. The secondary energy source 78 thus acts to direct radiation to the surface.

Immediately thereafter, block 196 directs the processor circuit to selectively vary the opacity of each of the image producing pixels 86 on the LCD panel 82, to selectively irradiate corresponding projection areas 96 on the lower surface 35 of the workpiece. For each of the projection areas 96, the processor circuit is directed to produce LCD image producing pixel control signals to control the image producing pixel corresponding to the particular projection area to assume a shade of grey determined by the corresponding correction value stored in the corrective power store 140. For example, if the correction value corresponding to a particular projection area is zero, the processor circuit renders the corresponding image producing pixel black or opaque. If the correction value is 15, the processor circuit renders the corresponding image producing pixel transparent. For intermediate correction values, the image producing pixels are controlled to assume respective discrete shades of grey. The above step is repeated until the processor circuit has produced and provided LCD image producing pixel control signals to control all of the image producing pixels 86. In effect, the LCD panel 82 acts as a filtering member interposed between the secondary energy source and the lower surface of the workpiece, the filtering member having a plurality of filter portions, each of the plurality of filter portions having a variable opacity, and the processor circuit is programmed to selectively vary, as a function of the representation of the spatial temperature distribution across the workpiece, the variable opacity of each of the plurality of filter portions, thereby producing the desired spatial temperature distribution in the workpiece. The processor circuit is thus programmed to vary irradiance produced by at least one of the primary and corrective energy sources.

Thus, at this point in the thermal cycle, the secondary energy source 78 and the reflector 80 project radiation toward the LCD panel 82. Each of the LCD image producing pixels 86 has a variable opacity, as determined by the corrective power representation, and radiation passing through each image producing pixel 86 is projected through the LCD imaging optics system 84 onto a particular corresponding projection area 96 on the lower surface of the workpiece. Thus, a corrective irradiance image of the LCD panel 82 is projected onto the workpiece. The corrective energy source 60 thus acts as an irradiance system for irradiating a plurality of areas on a surface of the workpiece to create localized heating of the workpiece in the areas, to change the spatial temperature distribution to produce the desired spatial temperature distribution in the workpiece. The processor circuit is in communication with the irradiance system, and is programmed to control the irradiance system, particularly the LCD panel, to expose each one of the plurality of areas to radiation to produce the localized heating. In effect, the processor circuit is programmed to control the irradiance system, or more particularly, the LCD panel, to control the amount of the localized heating by irradiating in response to the instantaneous spatial temperature error distribution. This is done by using the LCD panel to control the amount of radiation to which each of the areas is exposed, or to control the exposure of each of the areas to radiation.

Block 198 directs the processor circuit 66 to adjust the power of the primary energy source 52, in order to provide any macroscopic adjustments which may be required to produce the desired temperature distribution. It will be appreciated that the corrective irradiance image produced by the corrective energy source 60 can increase or decrease temperatures of the projection areas 96 on the workpiece relative to each other, but cannot reduce the absolute temperature of a projection area which is hotter than its desired temperature. Also, the corrective irradiance image produced by the corrective energy source may cause the average temperature of the workpiece to increase beyond its desired average temperature. In such cases it is desirable to reduce the power projected onto the workpiece by the primary energy source. Conversely, if the entire workpiece falls significantly below its desired temperature, it may be desirable to increase the power projected by the primary energy source.

Thus, block 198 directs the processor circuit to produce primary energy source control signals to adjust the power projected by the primary energy source 52 onto the workpiece. The processor circuit is directed to determine the magnitude of the power adjustment as a function of both the average power being projected onto the workpiece by the corrective energy source 60, and of the highest temperature error value stored in the temperature error store 138. For example, if the highest temperature error value is positive (indicating that the corresponding measurement area 110 of the workpiece is hotter than its desired temperature), the effect of block 198 would be to proportionally reduce the power projected by the primary energy source onto the workpiece. Conversely, if the highest temperature error value is negative and is less than a pre-defined value (such as −0.5, for example, indicating that every measurement area 110 is at least 0.5° C. cooler than its desired temperature), the effect of block 198 would be to increase the power projected by the primary energy source onto the workpiece. Thus, the means for irradiating includes means for varying irradiance produced by at least one of the primary and corrective means for irradiating.

Referring to FIGS. 6, 7A, 7B and 7C, a hypothetical example of blocks 186 to 198 is shown. It is assumed for simplicity that the desired temperature distribution is a uniform temperature of 1040° C. at all measurement areas 110 on the lower surface 35.

Figure 7A:
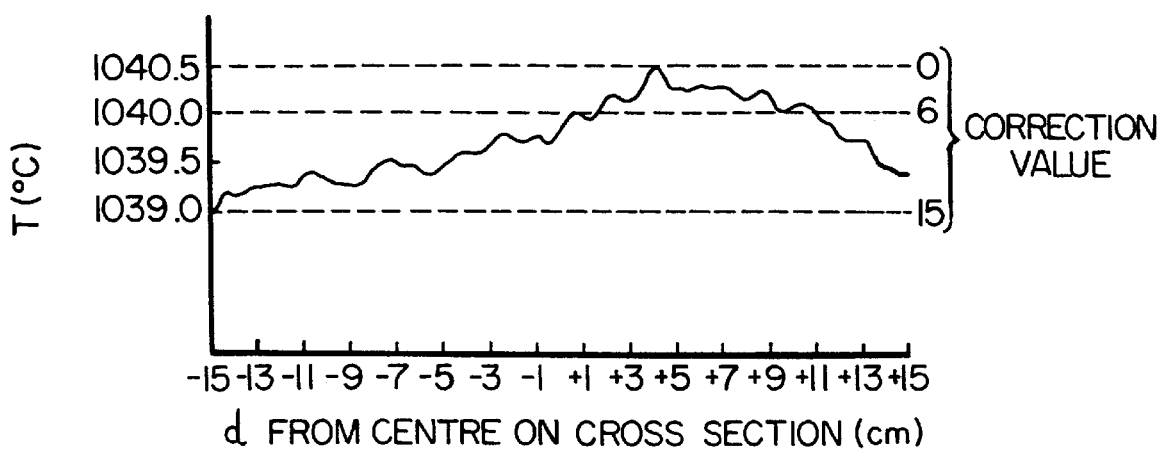
FIGS. 7A–7C are graphical representations of a hypothetical temperature curve of a cross-section of the workpiece shown in FIG. 1.

FIG. 7A illustrates a spatial temperature distribution across a vertical cross-section of the workpiece, ranging from 1039.00° C. to 1040.50° C., as calculated at block 186. The resulting temperature error distribution calculated at block 188 would thus contain temperature error values ranging from ±0.50 to −1.00. At block 190, a correction value of zero would be assigned to any of the projection areas 96 having an average temperature error of ±0.5 (or in other words, an average temperature of 1040.5° C.), a correction value of 2 would be assigned to any projection area 96 having an average temperature error of ±0.3, a correction value of 6 would be assigned to any projection area 96 having an average temperature error of zero (average temperature of 1040.0° C.), a correction value of 12 would be assigned to any projection area 96 having an average temperature of −0.7 (average temperature of 1039.3° C.), a correction value of 15 would be assigned to any projection area 96 having an average temperature error of −1.0 (average temperature of 1039° C.), and so on. Block 194 would then direct the processor circuit to activate the secondary energy source 78 to project radiation through the LCD panel 82 and the LCD imaging optics system 84 onto the lower surface of the workpiece. For each of the projection areas 96 on the workpiece, block 196 would direct the processor circuit to control the LCD image producing pixel 86 corresponding to that projection area to assume an opacity or shade of grey determined by the correction value corresponding to that projection area: LCD image producing pixels with corresponding correction values of zero would be opaque to the radiation projected by the secondary energy source, while image producing pixels with corresponding correction values of 15 would be essentially transparent. Thus, the corrective energy source would project virtually no radiation onto the projection area(s) having a correction value of zero (temperature of 1040.5° C.), and would project the greatest intensity of radiation onto the projection area(s) having a correction value of 15 (temperature of 1039.0° C.).

Figure 7B:
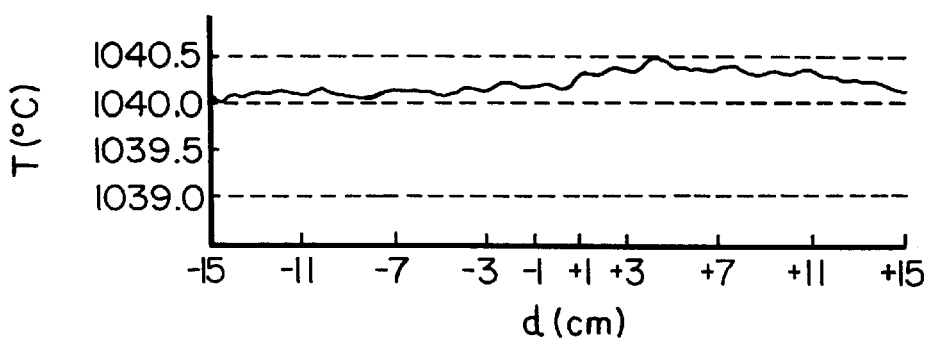

Referring to FIGS. 6 and 7B, it will be appreciated that in this example, blocks 190 to 196 would tend to increase the temperature of all projection areas toward the temperature of the hottest areas on the workpiece (temperature of 1040.5° C., correction value zero). In other words, in this example, blocks 190 to 196 tend to "flatten" the temperature curve. More generally, blocks 190 to 196 cause the temperature curve to tend to assume the relative shape of the desired temperature distribution curve.

Figure 7C:
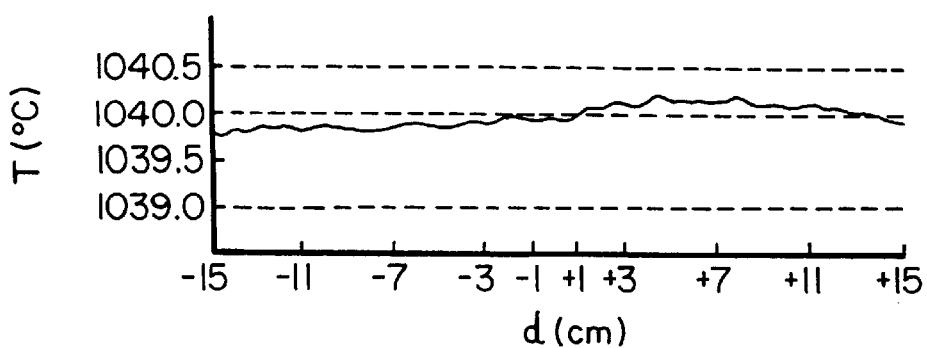

Referring to FIGS. 6 and 7C, in this example, block 198 would direct the processor circuit to reduce the power projected onto the workpiece by the primary energy source 52, resulting in greater net cooling (or more generally, reduced net heating) of the workpiece. In other words, the primary energy source power adjustment at block 198 tends to "shift" the flattened temperature curve as a whole, toward an average value of the desired temperature distribution.

Referring back to FIG. 6, block 200 then directs the processor circuit to graphically display desired information on the display 70. In this embodiment, the desired information is the temperature error distribution stored in the temperature error store 138. Block 200 directs the processor circuit to sequentially read the temperature error values in the temperature error store 138 corresponding to each of the measurement areas 110 on the lower surface 35 of the workpiece. For each of the measurement areas 110, the processor circuit is directed to produce a colour value as a function of the corresponding temperature error value and store the colour value in a corresponding location in the display store 142. Each colour value represents one of a plurality of discrete shades of red, orange, yellow, green, blue or violet available on the display 70. In this embodiment, the processor circuit is directed to produce a colour value representing the shortest-wavelength shade of violet available on the display for any temperature error values greater than or equal to +3.00° C., a colour value representing the longest-wavelength shade of red available on the display for any temperature error values less than or equal to −3.00° C., and to produce colour values representing intermediate colours which range from red to orange to yellow to green to blue to violet for temperature error values ranging from −3.00° C. to +3.00° C. respectively. Once all such colour values have been stored in the display store 142, block 200 directs the processor circuit to produce display control signals to cause the display 70 to display the contents of the display store 142.

Referring back to FIG. 1, for each of the measurement areas 110 of the workpiece, the processor circuit controls a corresponding display pixel 71 on the display 70 to emit the colour represented by the colour value stored in the corresponding location in the display store 142. Alternatively, depending on user preferences, representations of the contents of any of the various stores in the RAM 130 may be displayed by a similar colour assignment process, and different colour conversion scales may be used for any such displays.

Block 202 then directs the processor circuit to store the contents of the temperature store 136 in the archive folder 160 in the storage device 150, thus maintaining a record of the spatial temperature distribution across the lower surface of the workpiece at each point in time during the thermal cycle at which temperature was measured. Alternatively, however, depending on user preferences, any of the information contained in the various stores in the RAM 130 may be recorded in the storage device 150.

The processor circuit is then directed back to block 170, which directs the processor circuit to copy a representation of the desired temperature distribution corresponding to the next instant at which the temperature of the workpiece is to be measured from the desired temperature distribution folder 159 into the desired temperature distribution store 158.

Thereafter, the processor circuit repeats the above steps of blocks 170 to 202 for each successive desired temperature distribution, and the thermal cycle thus continues until such time as the processor circuit determines at block 172 that the first timer bit has been set active by the timer subroutine, and terminates the thermal cycle in response thereto.

Thus, the foregoing describes one embodiment of a system for producing a desired spatial temperature distribution across a workpiece. The processor circuit cooperates with the chamber, the measuring device and primary energy source to produce a representation of the spatial temperature distribution across the workpiece, which is compared to the desired temperature distribution. The processor circuit then cooperates with the primary and corrective energy sources to act as an irradiance system for irradiating a plurality of areas on a surface of the workpiece to create localized heating of the workpiece in those areas, to produce the desired spatial temperature distribution in the workpiece.

Alternatives

Primary Energy Source

The primary energy source 52 need not be an arc lamp. An alternative energy source, such as a plurality of tungsten lamps, for example, could be substituted for the arc lamp 54. Although tungsten lamps and other alternative energy sources may lack the advantages discussed above resulting from the short wavelength and fast response time of the arc lamp, such alternative energy sources may still provide sufficient efficiency and response time for many thermal processing applications.

As a further alternative, the primary energy source may be removed entirely, and the corrective energy source 60 may therefore act as the sole energy source heating the workpiece, depending upon the energy required to heat the workpiece to the desired temperature.

Figure 8:
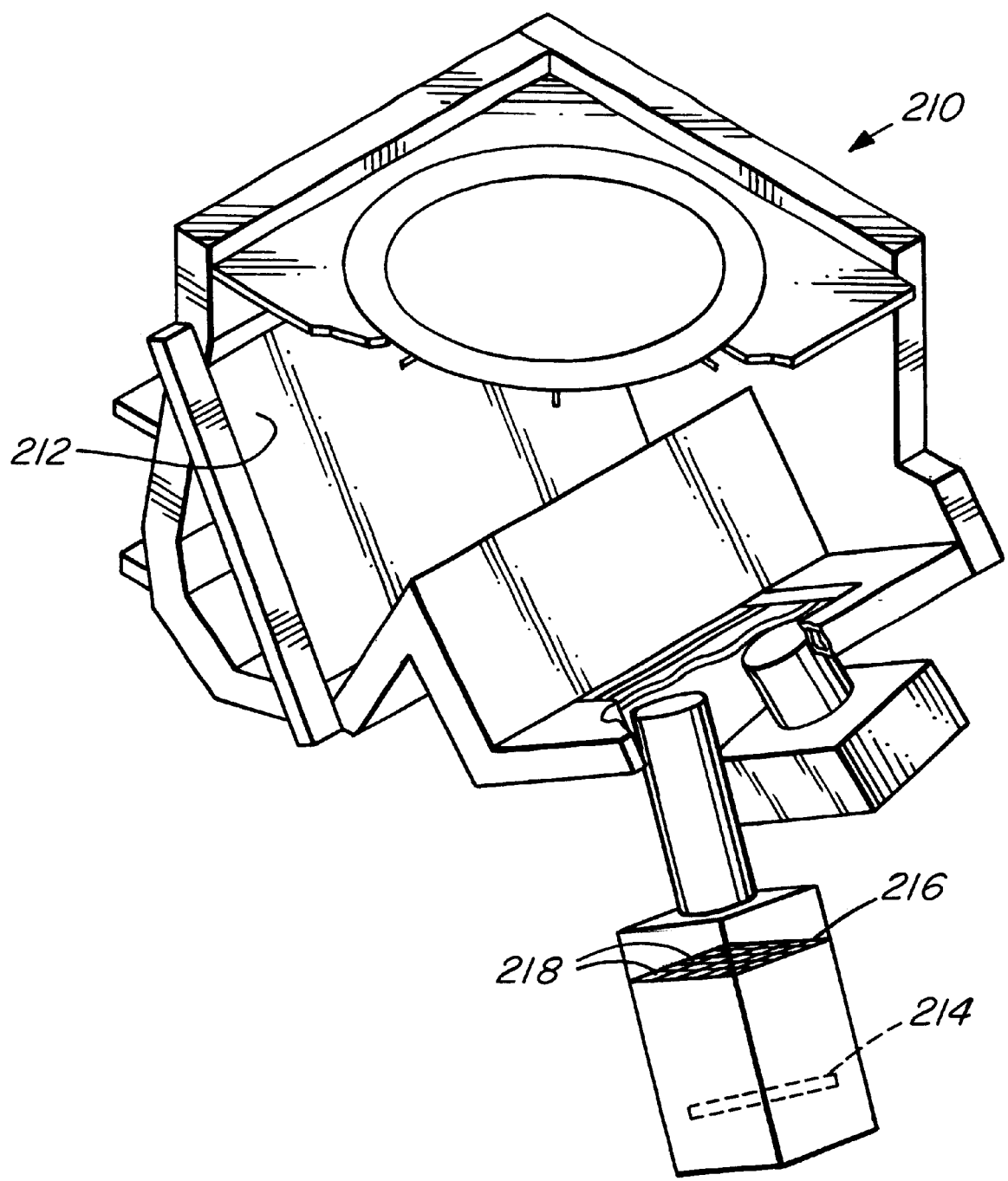
FIG. 8 is a fragmented perspective view of a system for producing a desired spatial temperature distribution across a workpiece, according to a second embodiment of the invention.

As shown in FIG. 8, a system for producing a desired spatial temperature distribution across a workpiece according to a second embodiment of the invention is designated generally by the reference character 210. The system 210 differs from the system 20 shown in FIG. 1 in that the primary energy source 52 has been removed, and the second angled window 50 has been replaced with a fourth lower angled wall 212. The fourth lower angled wall 212 includes radiation-absorbing material, which in this embodiment is black stainless steel, and thus acts as a radiation-absorbing surface. The secondary energy source 78 has been replaced with a sole energy source 214 capable of irradiating the workpiece with sufficient power to carry out a desired thermal cycle.

The LCD panel (82) has been replaced with a finer-greyscale LCD panel 216 which includes a plurality of LCD image producing pixels 218. In this embodiment, each of the image producing pixels has a greyscale of 256 shades of grey, represented by the numbers 0 (opaque) to 255 (transparent). The finer-greyscale LCD panel 216 enables the sole energy source to provide the desired ramp rate by delivering significant amounts of power to areas of the workpiece which are hotter than desired, while providing even higher amounts of power to areas of the workpiece which are cooler than desired. For example, in a hypothetical thermal cycle, the processor circuit might render an LCD image producing pixel 218 corresponding to the hottest projection area 96 on the workpiece partially transparent (rather than opaque), and render the pixel corresponding to the coolest projection area fully transparent.

Similarly, each of the various alternative corrective energy sources discussed below may be used as a sole energy source if desired.

Corrective Energy Source

Figure 9:
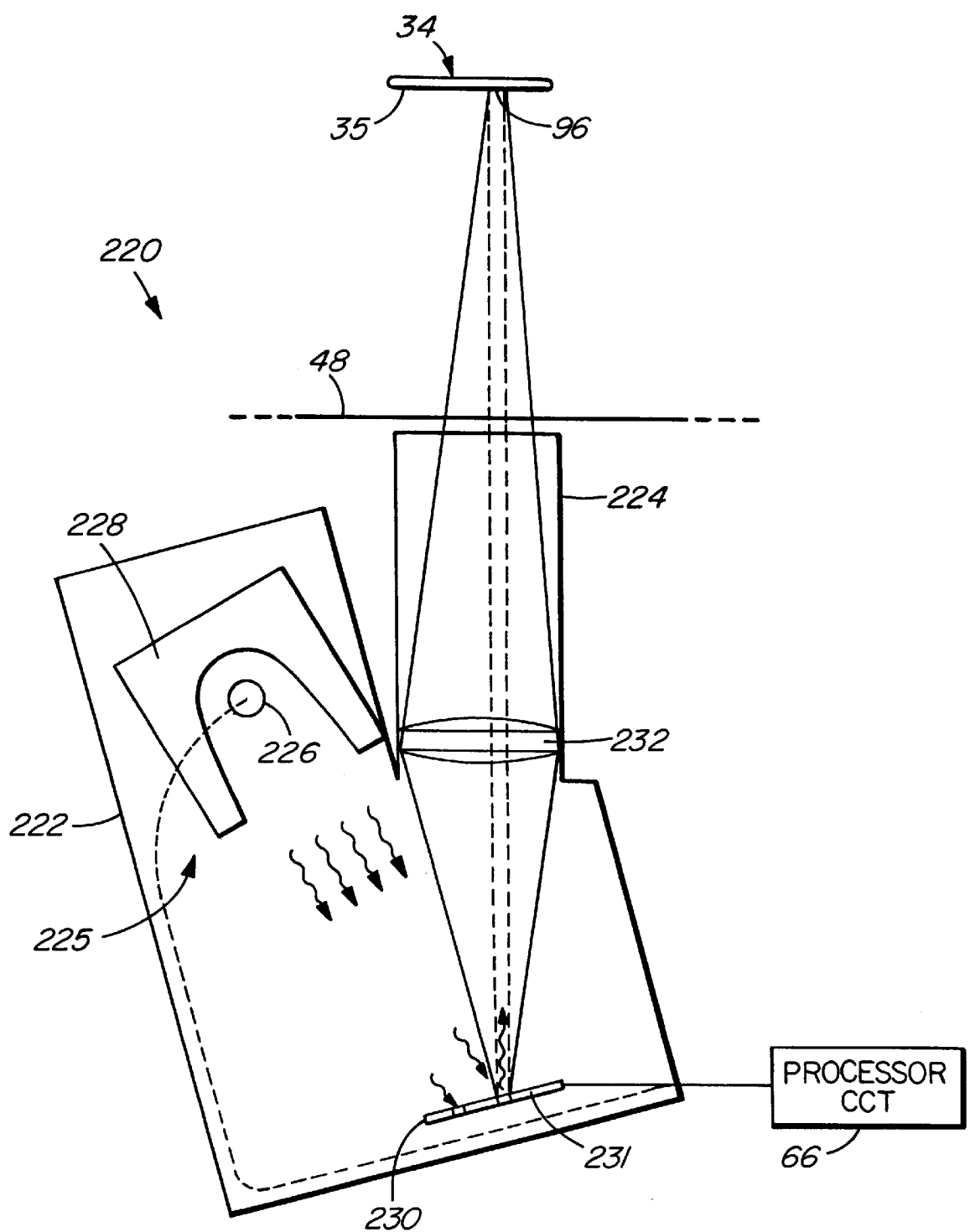
FIG. 9 is a cross-sectional view of a corrective energy source of a system for producing a desired spatial temperature distribution across a workpiece, according to a third embodiment of the invention.

Referring to FIG. 9, a corrective energy source according to a third embodiment of the invention is shown generally at 220. The corrective energy source 220 has a body 222 and a focal barrel 224 mounted beneath the first angled window 48. Housed within the body is an irradiance source 225 for directing radiation, which in this embodiment includes an arc lamp 226 and a reflector 228. Thus, the irradiance source acts as at least one energy source. The irradiance source and reflector project radiation toward a reflective panel 230, which in this embodiment is a reflective LCD panel.

The reflective panel 230 differs from the LCD panel 82 of the first embodiment, in that it has a rear surface 231 (distal from the workpiece) coated with a highly reflective material. When the processor circuit 66 produces electrical image control signals to render a given LCD element or pixel of the reflective panel transparent, radiation incident upon that pixel passes through the pixel, strikes the rear surface 231, and is reflected, essentially undiminished (subject to minimum inherent power loss of an LCD panel). Conversely, when the processor circuit renders a given pixel opaque, radiation incident upon the pixel will be absorbed by the pixel, and when the processor circuit causes a pixel to assume an intermediate shade of grey, radiation incident upon that pixel will be partly absorbed by the pixel and partly reflected back through the pixel by the rear surface 231. Thus, in effect, the reflective panel 230 includes a plurality of image producing pixels, each of which has a variable reflectivity.

An imaging optics system 232 is housed within the focal barrel 224, and is operable to project an image of the reflective panel 230 onto the lower surface 35 of the workpiece 34, such that each of the image producing pixels on the reflective panel corresponds to a particular projection area 96 on the lower surface of the workpiece. Thus, the reflective panel 230 acts to reflect the radiation from the irradiance source 225 to the surface of the workpiece.

In this embodiment, the processor circuit 66 produces corrective energy source control signals to selectively control each of the image producing pixels on the reflective panel 230 to assume a discrete reflectivity value, as determined by the corresponding correction value stored in the corrective power store 140. Radiation projected onto the reflective panel by the irradiance source 225 is thus selectively reflected by the reflective panel 230 through the imaging optics system 232 onto each of the projection areas on the lower surface 35 of the workpiece 34. Thus, the irradiance system includes a reflecting member oriented to reflect radiation incident from the at least one energy source to the surface, the reflecting member having a plurality of reflector portions, each of the plurality of reflector portions having a variable reflectivity. The processor circuit is programmed to selectively vary, as a function of the representation of the spatial temperature distribution across the workpiece, the variable reflectivity of each of the plurality of reflector portions of the reflecting member, thereby producing the desired spatial temperature distribution in the workpiece.

Any suitable array of reflective elements each having a variable reflectivity may be substituted for the reflective LCD panel.

Figure 10:
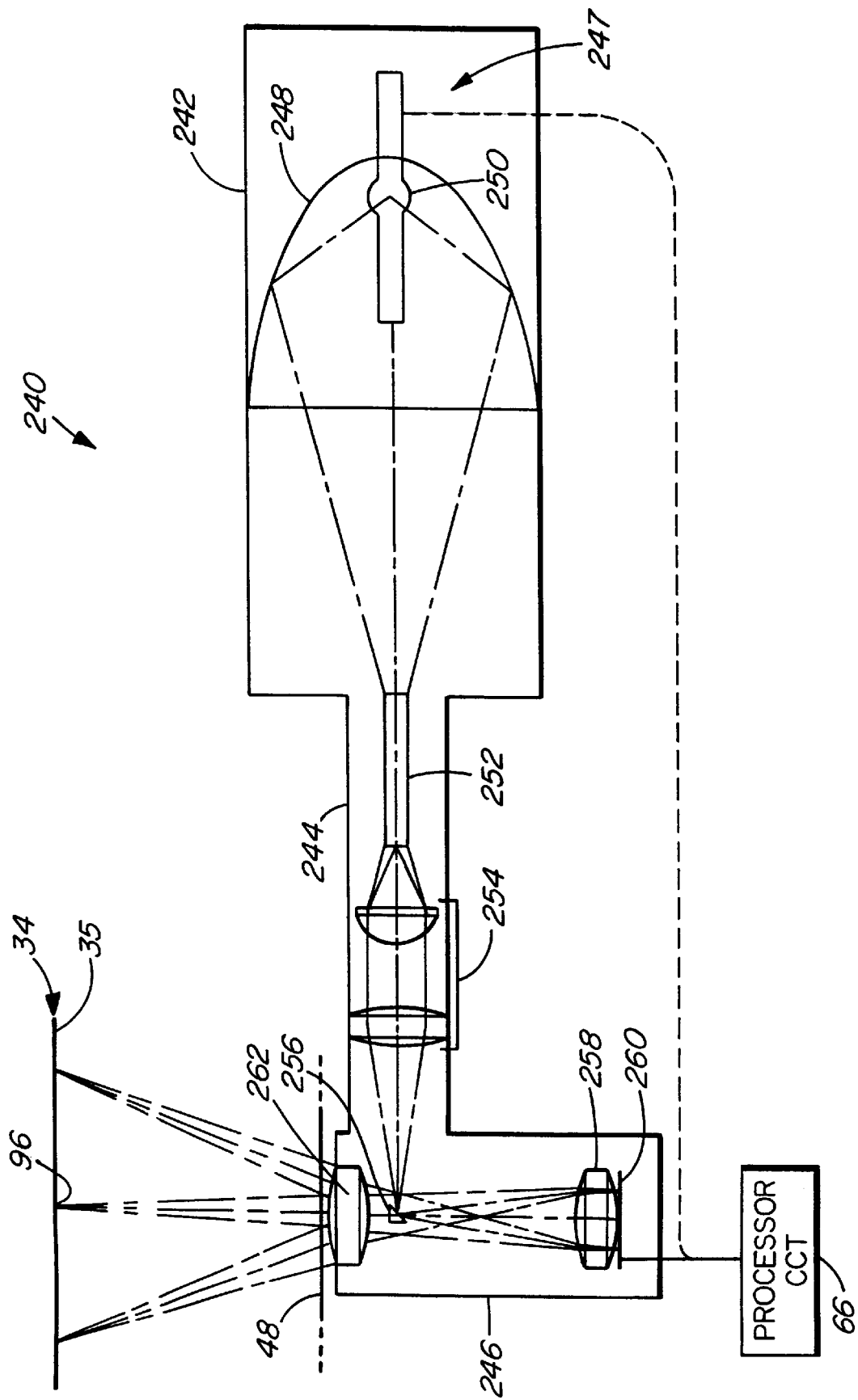
FIG. 10 is a cross-sectional view of a corrective energy source of a system for producing a desired spatial temperature distribution across a workpiece, according to a fourth embodiment of the invention.

Referring to FIG. 10, a corrective energy source according to a fourth embodiment of the invention is shown generally at 240. The corrective energy source 240 includes a first body portion 242, a second body portion 244, and a focal barrel 246 mounted beneath the first angled window 48. Housed within the first body portion 242 is an irradiance source 247 for directing radiation, which in this embodiment includes a reflector 248 and an arc lamp 250. The arc lamp and reflector cooperate to project radiation through an integrator 252 into a condenser 254 housed within the second body portion. The condenser 254 condenses and projects the radiation onto a Schlieren stop 256 in the focal barrel 246, which reflects the radiation through a Schlieren lens 258 onto a reflective panel 260, which in this embodiment is a reflective LCD panel similar to the reflective panel 230 previously described. The reflective panel 260 includes a plurality of reflective LCD pixels or image producing pixels. Radiation reflected by the image-producing pixels passes back through the Schlieren lens 258 and through a projection lens 262, which projects an image of the reflective panel 260 onto the lower surface 35 of the workpiece 34, such that each image producing pixel corresponds to a particular projection area 96 on the lower surface of the workpiece.

The processor circuit produces reflector control signals to selectively vary the reflectivity of each of the image producing pixels to selectively vary the intensity of radiation projected onto each of the projection areas 96 on the workpiece.

Figure 11:
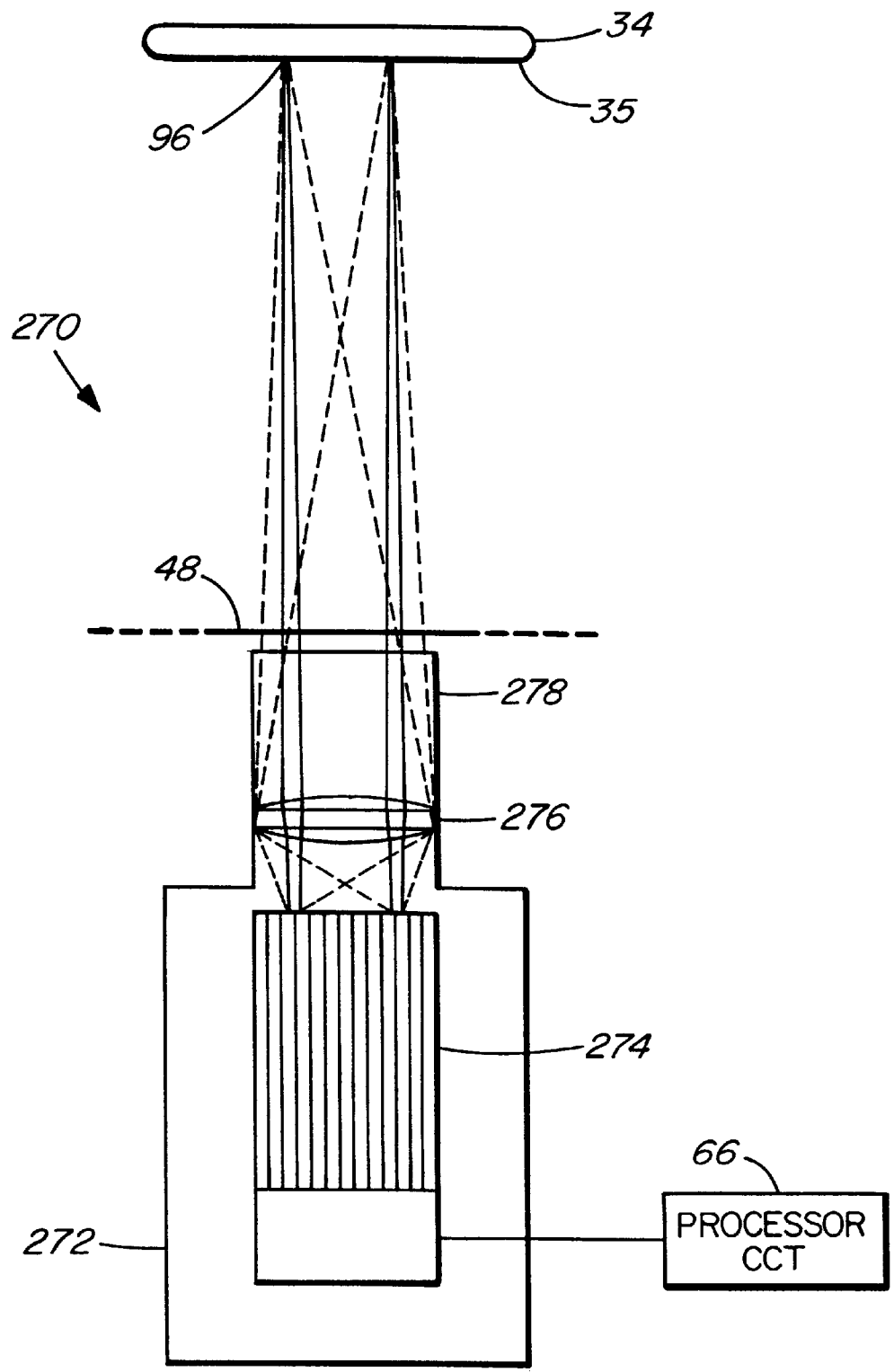
FIG. 11 is a cross-sectional view of a corrective energy source of a system for producing a desired spatial temperature distribution across a workpiece, according to a fifth embodiment of the invention.

Referring to FIG. 11, a corrective energy source according to a fifth embodiment of the invention is shown generally at 270. Housed within a body 272 of the corrective energy source is an array of energy sources or irradiance sources 274 for projecting radiation onto the lower surface of the workpiece. The irradiance sources may include light-emitting diodes or laser diodes, for example.

Alternatively, any other suitable array of irradiance sources, such as an array of lasers or an array of tungsten lamps, for example, may be substituted. An imaging optics system 276 is housed within a focal barrel 278 mounted beneath the first angled window 48. The array of irradiance sources projects radiation through the imaging optics system 276, which projects an image of the array onto the lower surface 35 of the workpiece 34, such that each one of the irradiance sources 274 projects radiation onto a particular projection area 96 on the lower surface 35 of the workpiece 34. The processor circuit 66 produces irradiance control signals to selectively vary the power projected by each one of the irradiance sources 274 onto each corresponding projection area 96 on the lower surface of the workpiece. Thus, the processor circuit 66 acts to selectively vary, as a function of the representation of the spatial temperature distribution across the workpiece, an intensity of radiation emitted by each of the energy sources or irradiance sources 274. The imaging optics system 276 provides at least one lens interposed between the array of energy sources and the workpiece.

Figure 12:
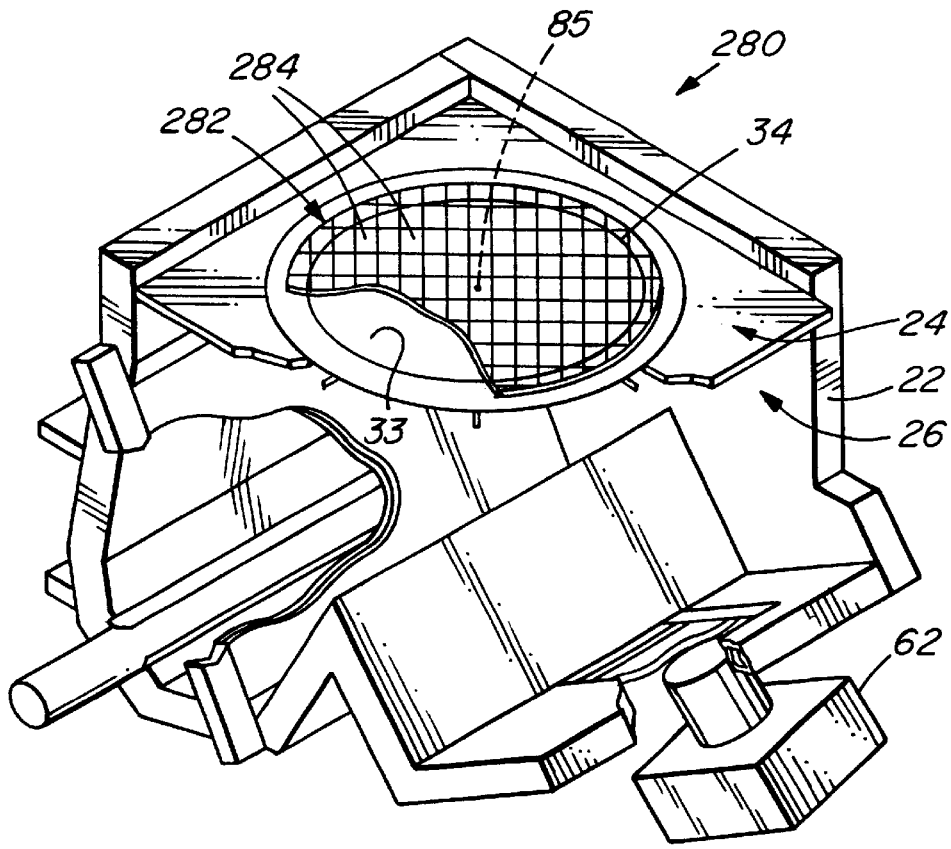
FIG. 12 is a fragmented perspective view of a system for producing a desired spatial temperature distribution across a workpiece, according to a sixth embodiment of the invention.
Figure 13:
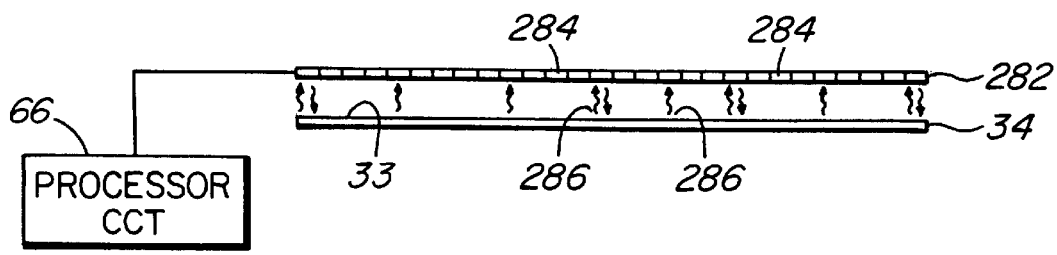
FIG. 13 is a cross-sectional view of a corrective energy source of the system shown in FIG. 12.

As shown in FIGS. 12 and 13, a system for producing a desired spatial temperature distribution across a workpiece according to a sixth embodiment of the invention is designated generally by the reference character 280. The corrective energy source 60 shown in FIG. 1 has been removed and replaced with a corrective energy source 282 mounted in the upper portion 24 of the chamber 22, centred directly above and parallel to the workpiece 34. In this embodiment, the corrective energy source 282 includes an array of infrared reflector panels 284 for reflecting radiation thermally emitted by the workpiece surface back to the surface. Each of the infrared reflector panels 284 has a variable reflectivity, and is operable to reflect infrared radiation thermally emitted by a particular corresponding reflection area 286 on the upper surface 33 of the workpiece 34 back to that corresponding reflection area 286. In this embodiment, the correction values stored in the corrective power store 140 shown in FIG. 5 correspond to particular reflection areas 286 on the upper surface 33, each reflection area corresponding to a plurality of measurement areas 110 on the lower surface 35. For each of the reflection areas 286, the processor circuit 66 produces infrared reflector control signals to control the corresponding infrared reflector panel 284 to assume a degree of reflectivity proportional to the corresponding correction value. In other words, the irradiance system includes a reflecting member for reflecting radiation thermally emitted by the surface back to the surface, the reflecting member having a plurality of reflector portions, each of the plurality of reflector portions having a variable reflectivity. The processor circuit is programmed to selectively vary, as a function of the representation of the spatial temperature distribution across the workpiece, the variable reflectivity of each of the plurality of reflector portions, thereby producing the desired spatial temperature distribution in the workpiece. Thus the processor circuit is operable to selectively vary the intensity or amount of thermally emitted infrared radiation reflected back to each of the reflection areas 286 on the upper surface of the workpiece.

Figure 14:
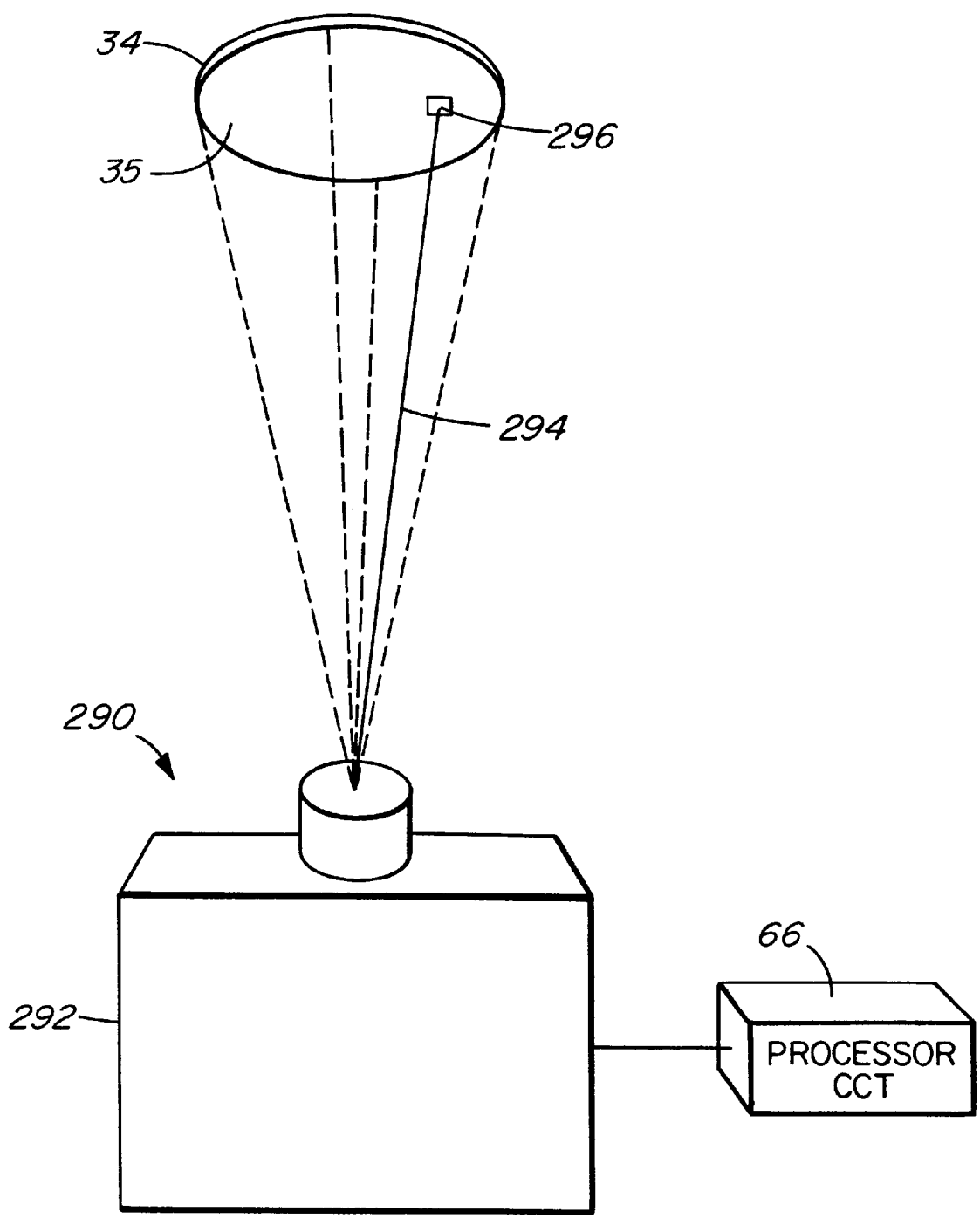
FIG. 14 is a perspective view of a corrective energy source of a system for producing a desired spatial temperature distribution across a workpiece, according to a seventh embodiment of the invention.

Referring to FIG. 14, a corrective energy source according to a seventh embodiment of the invention is shown generally at 290. The corrective energy source 290 includes a scanning laser 292 for scanning a laser beam 294 across the entire lower surface 35 of the workpiece 34. The scanning laser 292 includes a scan circuit (not shown) which operates on a similar principle to a raster scan circuit for a television set. The processor circuit 66 produces laser control signals to cause the laser beam 294 to remain incident upon each one of a plurality of laser projection areas 296 on the lower surface of the workpiece for a time period determined by a correction value corresponding to that particular laser projection area 296, stored in the corrective power store 140. Thus, the laser beam 294 will quickly scan over the laser projection areas 296 which are hottest relative to their desired temperature, but will remain incident upon cooler areas for proportionally longer periods of time, thus providing greater heating of such cooler areas. In other words, the processor circuit is programmed to selectively vary, as a function of the representation of the spatial temperature distribution across the workpiece, a time during which the laser beam remains incident upon the surface in the vicinity of each of the laser projection areas respectively.

Alternatively, the laser beam may remain incident on each laser projection area 296 for an equal period of time, and the processor circuit may selectively control the power of the laser beam as it scans across each of the laser projection areas 296. Thus, the processor circuit is programmed to selectively vary, as a function of the representation of the spatial temperature distribution, a power of the laser beam in the vicinity of each of the laser projection areas respectively.

Measuring Device

Figure 15:
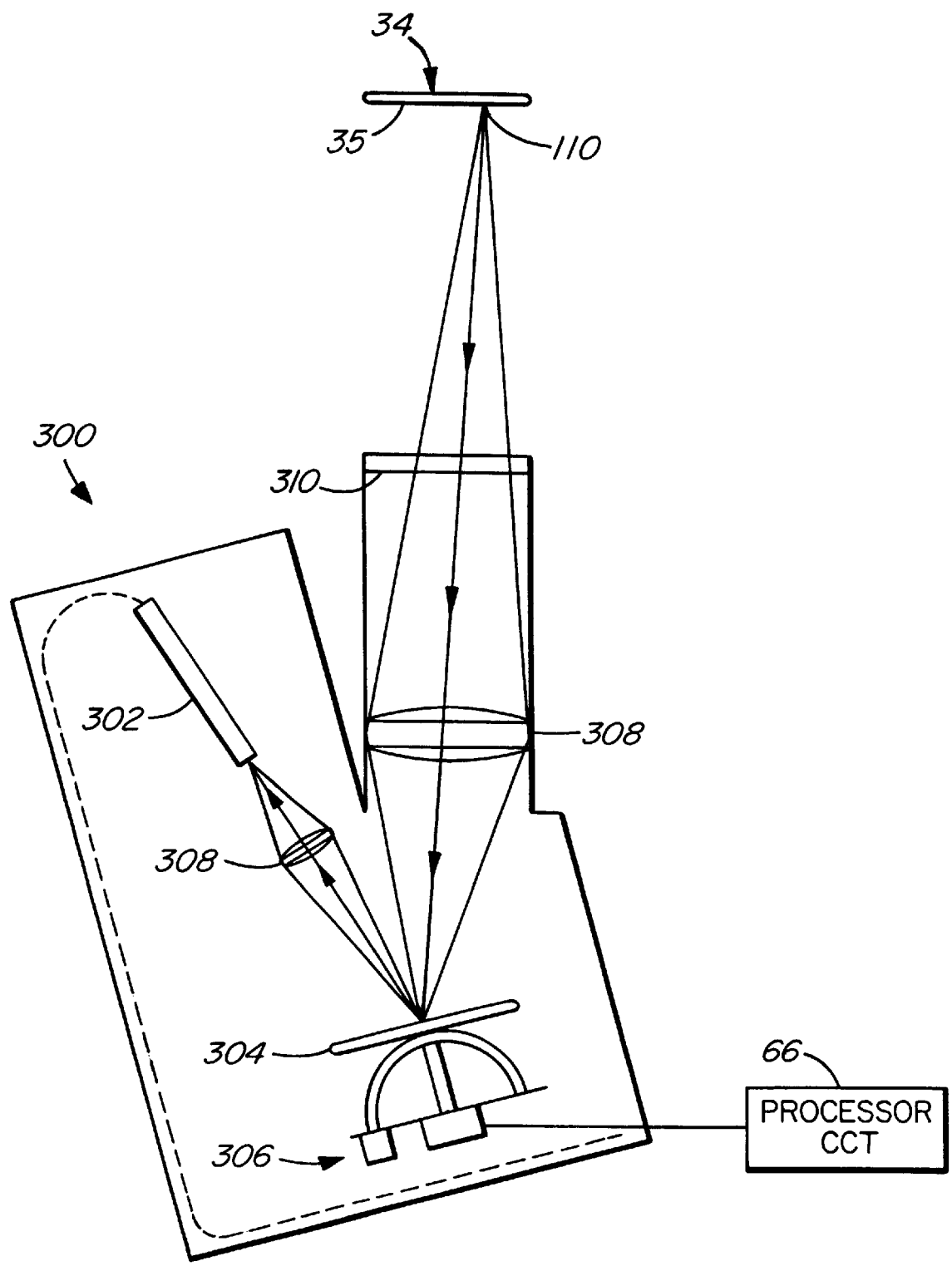
FIG. 15 is a cross-sectional view of a measuring device of a system for producing a desired spatial temperature distribution across a workpiece, according to an eighth embodiment of the invention.

Referring to FIG. 15, a measuring device according to an eighth embodiment of the invention is shown generally at 300. The measuring device 300 includes a linear detector 302, a movable mirror 304, a mirror motion assembly 306, and an optics system 308 illustrated by representative lenses in FIG. 15. A filter 310 within the measuring device is interposed between the optics system and the workpiece. The optics system 308 and the movable mirror 304 cooperate to focus and reflect radiation emitted or reflected by a particular measurement area 110 of the lower surface 35 to the linear detector 302. In this embodiment, the mirror motion assembly 306 operates on a similar principle to an alt-azimuth mounting assembly of a telescope, although on a much smaller and faster scale. Alternatively, any other suitable motion assembly may be substituted therefor. The processor circuit 66 produces mirror control signals to control the mirror motion assembly 306 to cause the movable mirror to move incrementally, thus reflecting radiation emitted or reflected by successive measurement areas 110 on the lower surface of the workpiece into the linear detector. With each incremental movement of the mirror, the processor circuit produces detector control signals to cause the linear detector to sequentially measure radiation emitted or reflected from each of the successive adjacent measurement areas 110. In this manner, the processor circuit produces mirror control signals to effectively control the linear detector to perform a raster scan across the entire lower surface of the workpiece, by moving the mirror rather than the detector. In other words, the measuring system includes a detector, a movable mirror and a mirror control device (the mirror motion assembly) in communication with the processor circuit. The processor circuit is programmed to control the mirror control device to move the mirror among a plurality of mirror positions, each of the mirror positions corresponding to a respective one of the areas on the surface of the workpiece, thereby reflecting to the detector radiation from each of the areas respectively. The optics system 308 provides at least one lens interposed between the movable mirror and the workpiece, and at least one lens interposed between the detector and the movable mirror.

Figure 16:
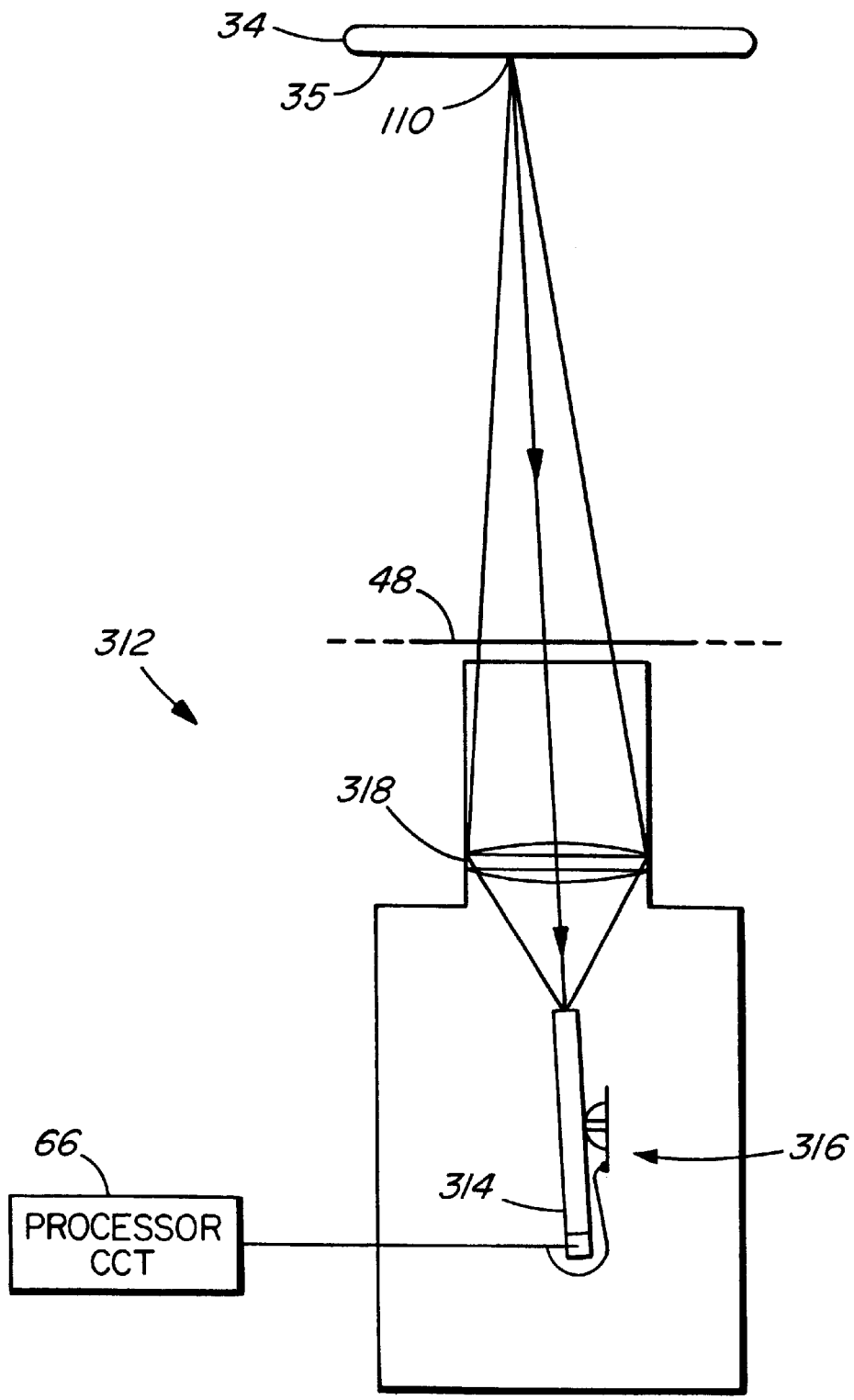
FIG. 16 is a cross-sectional view of a measuring device of a system for producing a desired spatial temperature distribution across a workpiece, according to a ninth embodiment of the invention.

Referring to FIG. 16, a measuring device according to a ninth embodiment of the invention is shown generally at 312. The measuring device includes a linear detector 314, a detector motion assembly 316 and an imaging optics system 318. The processor circuit 66 controls the detector motion assembly 316 to move the linear detector among a plurality of detector positions, each of the detector positions corresponding to a respective measurement area 110 on the lower surface of the workpiece, so that the detector receives radiation from each of the measurement areas. Thus, in this embodiment, the measuring system includes a detector and a detector control device (the detector motion assembly) in communication with the processor circuit. The processor circuit is programmed to control the detector control device to move the detector among a plurality of detector positions, each of the detector positions corresponding to a respective one of the areas on the surface of the workpiece, thereby receiving at the detector radiation from each of the areas respectively. The imaging optics system 318 provides at least one lens interposed between the detector and the workpiece.

Figure 17:
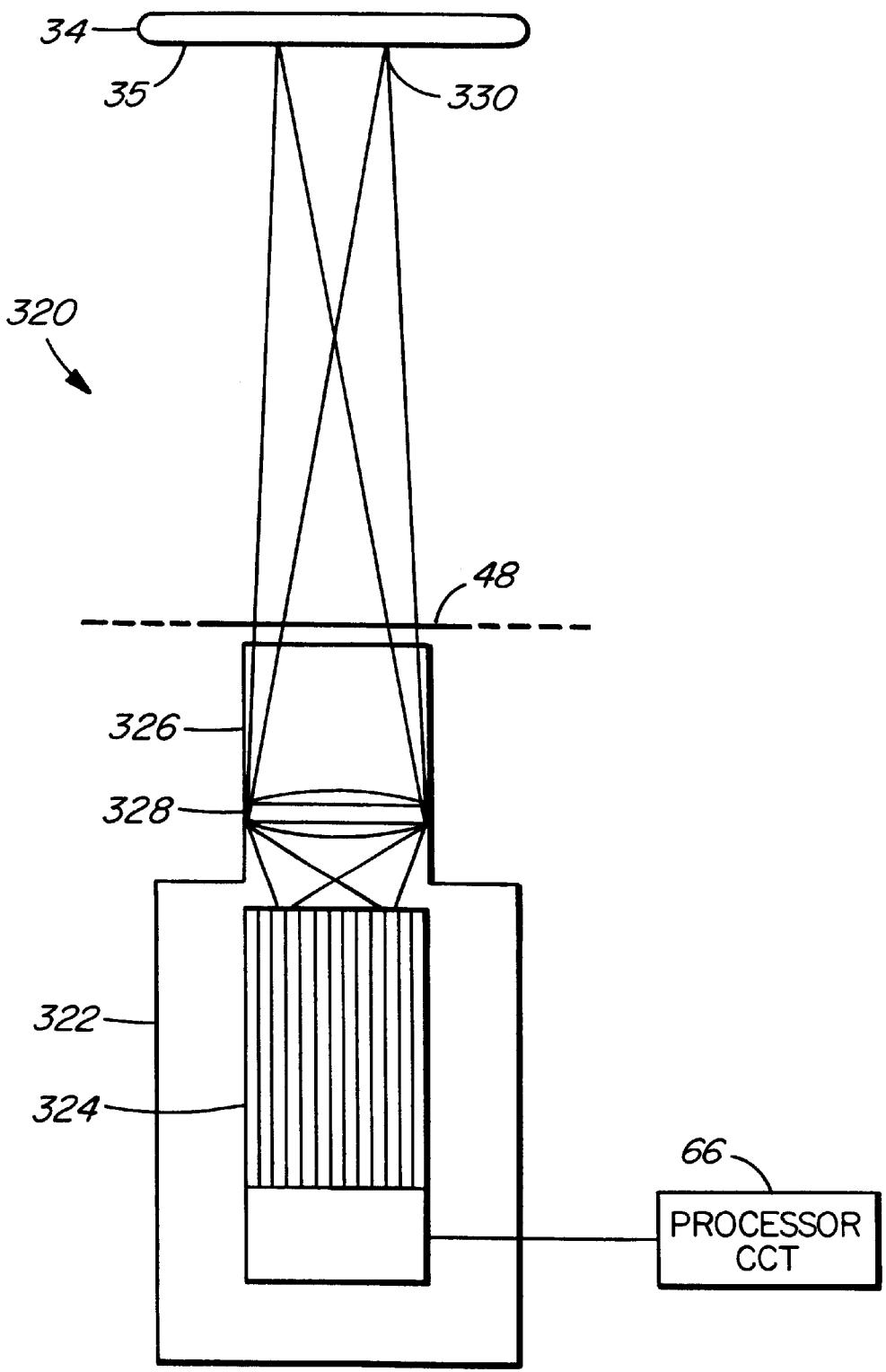
FIG. 17 is a cross-sectional view of a measuring device of a system for producing a desired spatial temperature distribution across a workpiece, according to a tenth embodiment of the invention.

Referring to FIG. 17, a measuring device according to a tenth embodiment of the invention is shown generally at 320. The measuring device 320 has a body 322 in which is housed an array of sensors 324, which in this embodiment is an array of photo diodes. The measuring device 320 also has a focal barrel 326 in which is housed an imaging optics system 328, which projects an image of the lower surface 35 of the workpiece onto the array of sensors 324, such that radiation from each one of a plurality of sensor areas 330 on the lower surface 35 of the workpiece is projected onto a particular corresponding one of the sensors 324. The measuring device 320 cooperates with the processor circuit to effectively measure temperature as described above. Thus, in this embodiment, the measuring system includes at least one radiation detector (the array of sensors), and at least one lens (the imaging optics system) interposed between the workpiece and the at least one radiation detector. This embodiment is particularly useful for lower-temperature applications, since photo diodes, although lacking the resolution of a CCD, are generally well-suited to measuring lower temperatures.

Alternatively, a smaller number of sensors may be combined with the mirror motion assembly 306 and the movable mirror 304 shown in FIG. 15 or the motion assembly shown in FIG. 16, resulting in a scanning array of sensors operable to scan across the lower surf ace of the workpiece.

In any of the embodiments described herein, the band-pass filter 100 shown in FIG. 1 need not have a band pass of $\lambda=900\pm5$ nm, and indeed, this band-pass may not be suitable for lower-temperature applications, for which a longer measurement wavelength may be required.

Processor Circuit

The processor circuit need not be housed within a general purpose computer. Alternatively, for example, a microcontroller in communication with the measuring device and all energy sources may be housed within the measuring device, or may be located at any other suitable location in the system. The RTP control routine and standard sets of parameters may be stored in a storage medium accessible by the microcontroller, such as electrically-erasable programmable read-only memory (EEPROM) or FLASH memory, for example.

RTP Control Routine

Although emissivity may vary from measurement area 110 to measurement area across the lower surface 35 of the workpiece, emissivity varies only weakly with temperature, and thus emissivity varies relatively slowly during a rapid thermal processing cycle. Thus, if it is desirable to conserve processing power, emissivity may be measured and calculated less frequently than temperature. For example, total (reflected+thermal) radiation might be measured and stored to determine emissivity only once per second during the thermal cycle, and emissivity may be assumed to be constant over the intervening second in order to calculate temperature from the more frequent measurements of thermal radiation.

In thermal cycles where the desired temperature distribution is a uniform temperature distribution throughout the workpiece at all times during the thermal cycle, processing power may be further conserved by eliminating the need to produce representations of desired temperature distributions or to compare the representations of actual spatial temperature distribution thereto. Referring back to FIG. 6, in an eleventh embodiment of the invention, blocks 170 and 188 may be eliminated, and the corrective power representation may be calculated at a modified block 190 directly from the contents of the temperature store. Where a 16-shade greyscale LCD is used, the modified block 190 directs the processor circuit to assign the number zero to the hottest measurement area 110, the number 15 to the coolest measurement area, and intermediate numbers to respective measurement areas with intermediate temperatures. For each projection area 96, the processor circuit averages the numbers so assigned to the measurement areas 110 comprised by the projection area, rounds the result to the nearest whole number and stores the rounded result in the corrective power store.

Additionally, in some cases, it may be desirable to factor out the band-pass and sensor response from equation (3) before calculating temperature. To achieve this, in a twelfth embodiment of the invention, a reference object (not shown) at a fixed temperature $T_{ref}$ with known emissivity $\epsilon_{ref}$ may be placed in the chamber in the field of view of the measuring device, and simultaneous measurements of intensity of thermal radiation of the reference object and the workpiece, $I_{ref}$ and $I_w$, may be obtained in a single image. Since both the reference object and workpiece simultaneously obey equation (2), the simultaneous equations for the reference object and the workpiece may be solved to yield $$T = \frac{hc}{\lambda k \ln\left[\frac{I_{ref}\epsilon_w}{I_w\epsilon_{ref}}(e^{hc/\lambda k T_{ref}} - 1)\right]} \quad (4)$$

where
  T= temperature of the workpiece measurement area 110
  $I_{ref}$= intensity of radiation thermally emitted by the reference object
  $I_w$= intensity of radiation thermally emitted by workpiece measurement area 110
  $\epsilon_w$= emissivity of the workpiece measurement area 110
  $\epsilon_{ref}$= known emissivity of the reference object
  $T_{ref}$= fixed temperature of the reference object
  $\lambda$= wavelength at which $I_w$ and $I_{ref}$ were measured (in this embodiment, $\lambda$=900 nm)
  c= speed of light
  h= Planck's constant
  k= Boltzmann's constant
  e= Euler's number Finally, in some cases it may be desirable to measure temperature via an alternative "flash" procedure, wherein the intensity of radiation reflected by the lower surface 35 of the workpiece is measured by "flashing" the workpiece at a predetermined power level sufficiently high that the intensity of radiation thermally emitted by the workpiece is negligible compared to the intensity of radiation reflected by the workpiece during the flash.

Referring back to FIG. 6, in a thirteenth embodiment of the invention, block 178 has been modified to direct the processor circuit 66 to effectively measure an intensity of radiation reflected by the lower surface 35 of the workpiece 34 during a flash at a pre-determined intensity produced by the primary energy source 52. Modified block 178 directs the processor circuit to produce secondary energy source control signals to deactivate the secondary energy source 78 if it had been activated immediately prior to block 178. The processor circuit is then directed to produce primary energy source control signals to control the primary energy source to produce a "flash" at the pre-determined power level. Due to the fast response time of the arc lamp 54, the arc lamp may easily be controlled to create a sufficiently short flash (less than one millisecond, for example) that the desired thermal cycle will not be appreciably affected by the flash. In this embodiment, the pre-determined power of the flash is also such that the intensity of radiation thermally emitted by the workpiece at its maximum temperature in a thermal cycle at the wavelength ($\lambda$=900±5 nm) of the band-pass filter 100 of the measuring device is negligible compared to the intensity of radiation reflected by the workpiece during the flash, and may be ignored. Simultaneously with the flash, the processor circuit is directed to produce measuring device control signals to control the measuring device 62 to cause the CCD 98 to capture an image of radiation reflected by the lower surface 35, or in other words, a representation of reflected intensity of the workpiece 34 during the "flash", for the purpose of emissivity-compensated temperature measurement. The image of the lower surface 35 of the workpiece 34 captured by the CCD 98 during the flash is a representation of intensity of radiation reflected by each of the plurality of measurement areas 110 on the lower surface during the flash. The processor circuit is further directed to produce measuring device control signals to cause the measuring device 62 to produce measurement signals representing the captured image of reflected intensity, which are communicated to the processor circuit 66 through the peripheral interface 126. The processor circuit is then directed to store the representation of reflected intensity so received in the total radiation store 132.

Blocks 180 and 182 direct the processor circuit to perform the same steps as described in the context of the first embodiment of the invention.

A modified block 184 then directs the processor circuit 66 to produce a representation of the emissivity of each of the plurality of measurement areas 110 on the lower surface 35 of the workpiece 34. Since the intensity of radiation thermally emitted by the workpiece during the "flash" is negligible compared to the intensity of radiation simultaneously reflected by the workpiece, the value stored in the total radiation store 132 already represents the intensity $I_{reflected}$ of radiation reflected by the corresponding measurement area 110. Accordingly, in this embodiment it is unnecessary to subtract the value stored in the corresponding location in the thermal radiation store 133. Thus, for each of the measurement areas 110, the corresponding representation stored in the total radiation store 132 is divided by the intensity of radiation incident upon that area during the flash. Since the flash was at a pre-determined power level, the incident intensity during the flash is a known constant for each of the measurement areas 110, and is stored as data within the modified RTP control routine 154. Thus, in this embodiment the radiation sensor 49 is unnecessary. The result of this division represents the reflectivity of that measurement area 110, and is then subtracted from one to yield the emissivity of that measurement area. Modified block 184 directs the processor circuit to store the emissivity value for that measurement area into a location in the emissivity store 134 in the RAM 130 corresponding to that particular measurement area 110. The above steps are repeated until an emissivity value has been calculated and stored in the emissivity store for each one of the plurality of measurement areas 110. The remainder of the RTP control routine proceeds as described above.

Although the "flash" procedure conserves processing power by eliminating both a calculation step (subtraction of thermal intensity from total (reflected+thermal) intensity) and a measurement step (incident intensity as measured by the radiation sensor 49), it requires a highly-powerful "flash" for higher-temperature thermal processing. Also, since incident intensity is inferred from the pre-determined power level of the flash rather than directly measured, an additional source of measurement error may be introduced if the primary energy source is not precisely calibrated. To address these difficulties, the "flash" procedure may be further modified so that incident intensity is measured by the radiation sensor 49, as described above in the context of the first embodiment. Also, to avoid the necessity of producing an overly-powerful flash, the RTP control routine may be further modified to use a lower-power "flash" measurement procedure in the lower-temperature stages of a thermal cycle, or perhaps only to produce an initial room-temperature measurement of emissivity and temperature, and to revert to the measurement procedure described in the context of the first embodiment for the higher-temperature stages of the thermal cycle.

While specific embodiments of the invention have been described and illustrated, such embodiments should be considered illustrative of the invention only and not as limiting the invention as construed in accordance with the accompanying claims.

What is claimed is:

1. A method for producing a desired spatial temperature distribution across a workpiece, comprising irradiating a plurality of areas on a surface of the workpiece in response to a representation of a temperature distribution as a function of at least two independent spatial variables across the workpiece, to create localized heating of the workpiece in said areas, to produce the desired spatial temperature distribution in the workpiece.

2. A method as claimed in claim 1 wherein irradiating includes exposing each one of said plurality of areas to radiation to produce said localized heating.

3. A method as claimed in claim 2 further including producing as said representation, a representation of an instantaneous spatial temperature distribution in the workpiece.

4. A method as claimed in claim 3 further including producing an instantaneous spatial temperature error distribution as a function of the desired spatial temperature distribution and said instantaneous spatial temperature distribution.

5. A method as claimed in claim 4 further including absorbing radiation exitant from said surface.

6. A method as claimed in claim 5 wherein producing said representation includes producing at least one signal representative of radiation intensity from said surface.

7. A method as claimed in claim 5 further including controlling the amount of said localized heating by irradiating in response to said instantaneous spatial temperature error distribution.

8. A method as claimed in claim 7 wherein controlling the amount of said localized heating includes controlling the exposure of each of said areas to radiation.

9. A method as claimed in claim 7 wherein controlling the amount of said localized heating includes controlling the amount of radiation to which each of said areas is exposed.

10. A method as claimed in claim 2 wherein irradiating includes irradiating the workpiece with primary and corrective energy sources.

11. A method as claimed in claim 10 wherein irradiating further includes varying irradiance produced by at least one of said primary and corrective energy sources.

12. A method as claimed in claim 11 further including storing said representation.

13. A method as claimed in claim 5 wherein absorbing includes absorbing said radiation exitant from said surface in a radiation absorbing environment.

14. A method as claimed in claim 13 wherein absorbing includes absorbing said radiation exitant from said surface in at least one radiation absorbing surface.

15. A method as claimed in claim 14 further including cooling said at least one radiation absorbing surface.

16. A method as claimed in claim 2 wherein exposing includes directing radiation from at least one energy source to said surface.

17. A method as claimed in claim 16 wherein exposing further includes selectively varying as a function of said representation, a variable opacity of each of a plurality of filter portions of a filtering member interposed between said at least one energy source and said surface.

18. A method as claimed in claim 2 wherein exposing includes directing radiation from at least one energy source to a reflecting member.

19. A method as claimed in claim 18 wherein exposing further includes reflecting said radiation from said reflecting member to said surface.

20. A method as claimed in claim 19 wherein exposing further includes selectively varying, as a function of said representation, a variable reflectivity of each of a plurality of reflector portions of said reflecting member.

21. A method as claimed in claim 2 wherein exposing includes reflecting radiation thermally emitted by said surface back to said surface.

22. A method as claimed in claim 21 wherein exposing further includes selectively varying, as a function of said representation, a variable reflectivity of each of a plurality of reflector portions of a reflecting member oriented to reflect radiation thermally emitted by said surface back to said surface.

23. A method as claimed in claim 2 wherein exposing includes projecting radiation from an array of energy sources onto said surface.

24. A method as claimed in claim 23 wherein exposing further includes selectively varying, as a function of said representation, an intensity of radiation emitted by each of said energy sources.

25. A method as claimed in claim 2 wherein exposing includes scanning a laser beam across said surface.

26. A method as claimed in claim 25 wherein exposing further includes selectively varying, as a function of said representation, a time during which said laser beam remains incident upon said surface in the vicinity of each of said areas respectively.

27. A method as claimed in claim 25 wherein exposing further includes selectively varying, as a function of said representation, a power of said laser beam in the vicinity of each of said areas respectively.

\* \* \* \* \*

UNITED STATES PATENT AND TRADEMARK OFFICE
CERTIFICATE OF CORRECTION

PATENT NO. : 6,303,411 B1
DATED : October 16, 2001
INVENTOR(S) : Camm et al.

It is certified that error appears in the above-identified patent and that said Letters Patent is hereby corrected as shown below:

Column 31,
Line 2, delete "exitant" and add -- exidant --.

Signed and Sealed this

Twenty-first Day of May, 2002

Attest:

Attesting Officer

JAMES E. ROGAN
Director of the United States Patent and Trademark Office

UNITED STATES PATENT AND TRADEMARK OFFICE
CERTIFICATE OF CORRECTION

PATENT NO.    : 6,303,411 B1
DATED         : October 16, 2001
INVENTOR(S)   : David Malcolm Camm et al.

It is certified that error appears in the above-identified patent and that said Letters Patent is hereby corrected as shown below:

<u>Column 31,</u>
Line 2, "exitant" (as changed by Certificate of Correction issued May 21, 2002 to read -- exidant --) should be reinstated.

Signed and Sealed this

Eighth Day of July, 2003

JAMES E. ROGAN
*Director of the United States Patent and Trademark Office*